United States Patent
Sakata

(10) Patent No.: US 11,430,862 B2
(45) Date of Patent: Aug. 30, 2022

(54) SUPERJUNCTION SEMICONDUCTOR DEVICE INCLUDING PARALLEL PN STRUCTURES AND METHOD OF MANUFACTURING THEREOF

(71) Applicant: FUJI ELECTRIC CO., LTD., Kawasaki (JP)

(72) Inventor: Toshiaki Sakata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/807,140

(22) Filed: Mar. 2, 2020

(65) Prior Publication Data

US 2020/0328273 A1 Oct. 15, 2020

(30) Foreign Application Priority Data

Apr. 12, 2019 (JP) .............................. JP2019-076689
Sep. 25, 2019 (JP) .............................. JP2019-173822

(51) Int. Cl.
*H01L 29/06* (2006.01)
*H01L 29/10* (2006.01)
(Continued)

(52) U.S. Cl.
CPC ...... *H01L 29/0634* (2013.01); *H01L 21/2253* (2013.01); *H01L 21/266* (2013.01);
(Continued)

(58) Field of Classification Search
CPC ............. H01L 29/0634; H01L 29/1095; H01L 29/402; H01L 29/7802; H01L 29/66712; H01L 21/26513; H01L 21/266; H01L 21/324; H01L 21/2253; H01L 29/0615; H01L 29/0696; H01L 29/7811
(Continued)

(56) References Cited

U.S. PATENT DOCUMENTS 9,281,392 B2    3/2016 Weyers et al.
10,355,084 B1 *  7/2019 Nishi .................. H01L 29/0615
(Continued)

FOREIGN PATENT DOCUMENTS

JP    2006005275 A    1/2006
JP    2013149761 A    8/2013

*Primary Examiner* — Mohammad M Hoque
(74) *Attorney, Agent, or Firm* — Rabin & Berdo, P.C.

(57) ABSTRACT

A semiconductor device has an active region through which current flows and a termination structure region. On a front surface of a semiconductor substrate of a first conductivity type, a first semiconductor layer of the first conductivity type is provided. On a surface of the first semiconductor layer in the active region, a first parallel pn structure is provided including first columns of the first conductivity type and second columns of a second conductivity type disposed repeatedly alternating one another in a plane parallel to the front surface. In the termination structure region, a second parallel pn structure is provided including third columns of the first conductivity type and fourth columns of the second conductivity type disposed repeatedly alternating one another. On a surface of the second parallel pn structure, a first semiconductor region of the second conductivity type is provided including plural regions apart from one another.

12 Claims, 16 Drawing Sheets

(51) Int. Cl.
  *H01L 29/40* (2006.01)
  *H01L 29/78* (2006.01)
  *H01L 29/66* (2006.01)
  *H01L 21/265* (2006.01)
  *H01L 21/266* (2006.01)
  *H01L 21/324* (2006.01)
  *H01L 21/225* (2006.01)

(52) U.S. Cl.
  CPC ...... *H01L 21/26513* (2013.01); *H01L 21/324* (2013.01); *H01L 29/1095* (2013.01); *H01L 29/402* (2013.01); *H01L 29/66712* (2013.01); *H01L 29/7802* (2013.01)

(58) Field of Classification Search
  USPC .......................................................... 257/329
  See application file for complete search history.

(56) References Cited

U.S. PATENT DOCUMENTS

| | | | |
|---|---|---|---|
| 2005/0280086 A1 | 12/2005 | Saito et al. | |
| 2012/0070965 A1* | 3/2012 | Sasaki | H01L 29/7811 |
| | | | 438/478 |
| 2013/0181328 A1* | 7/2013 | Cao | H01L 29/0657 |
| | | | 257/618 |

\* cited by examiner

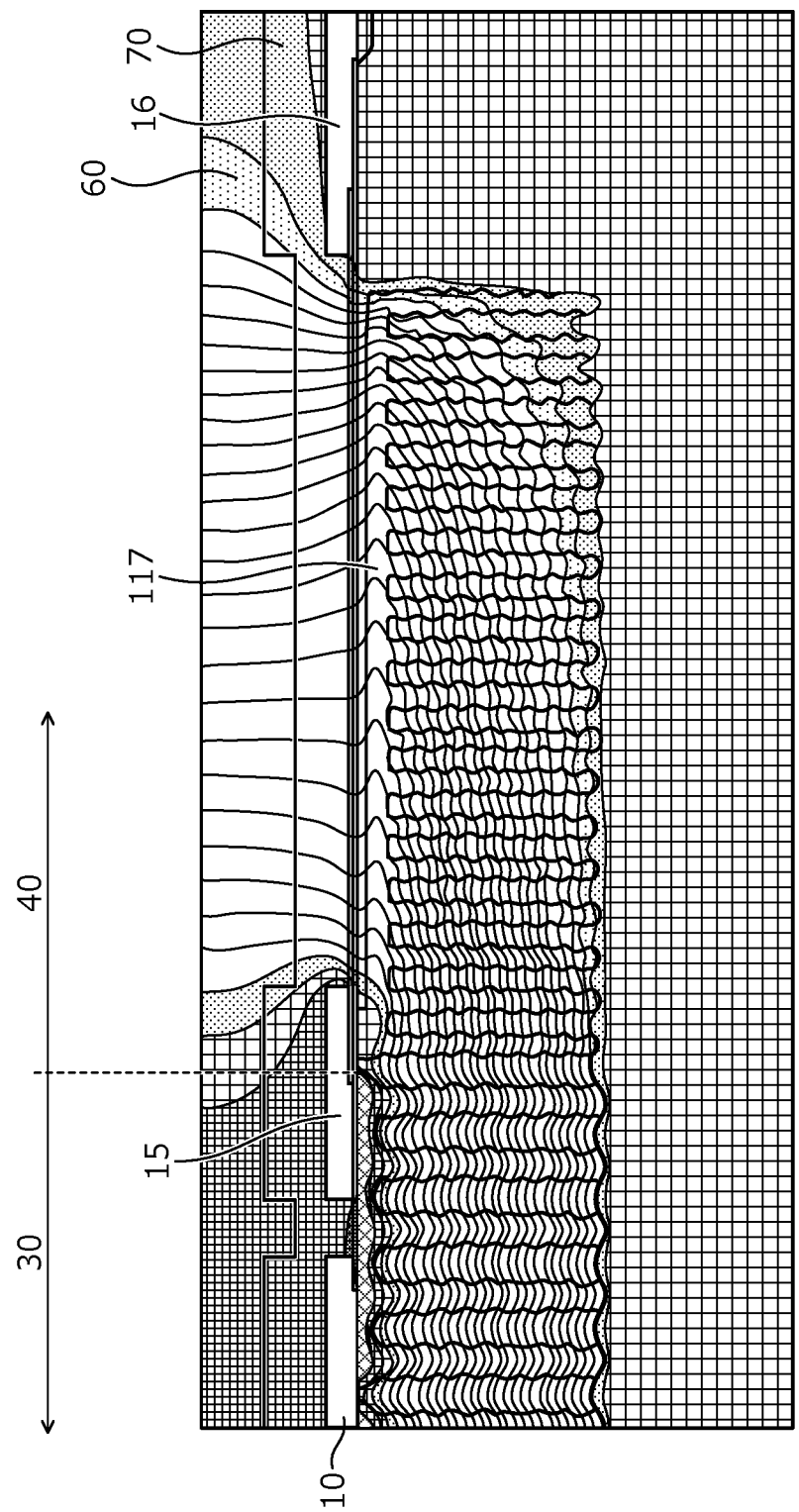

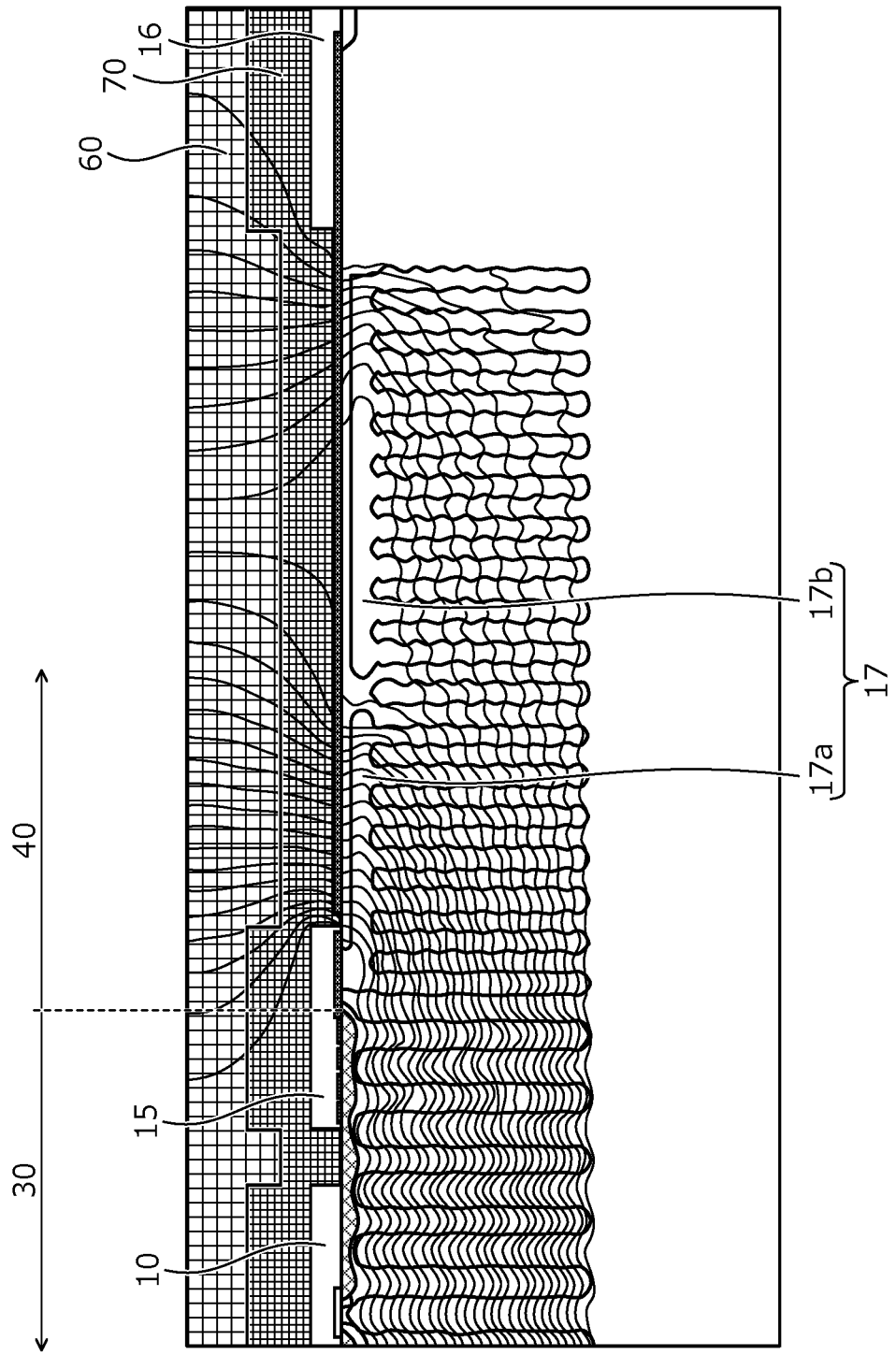

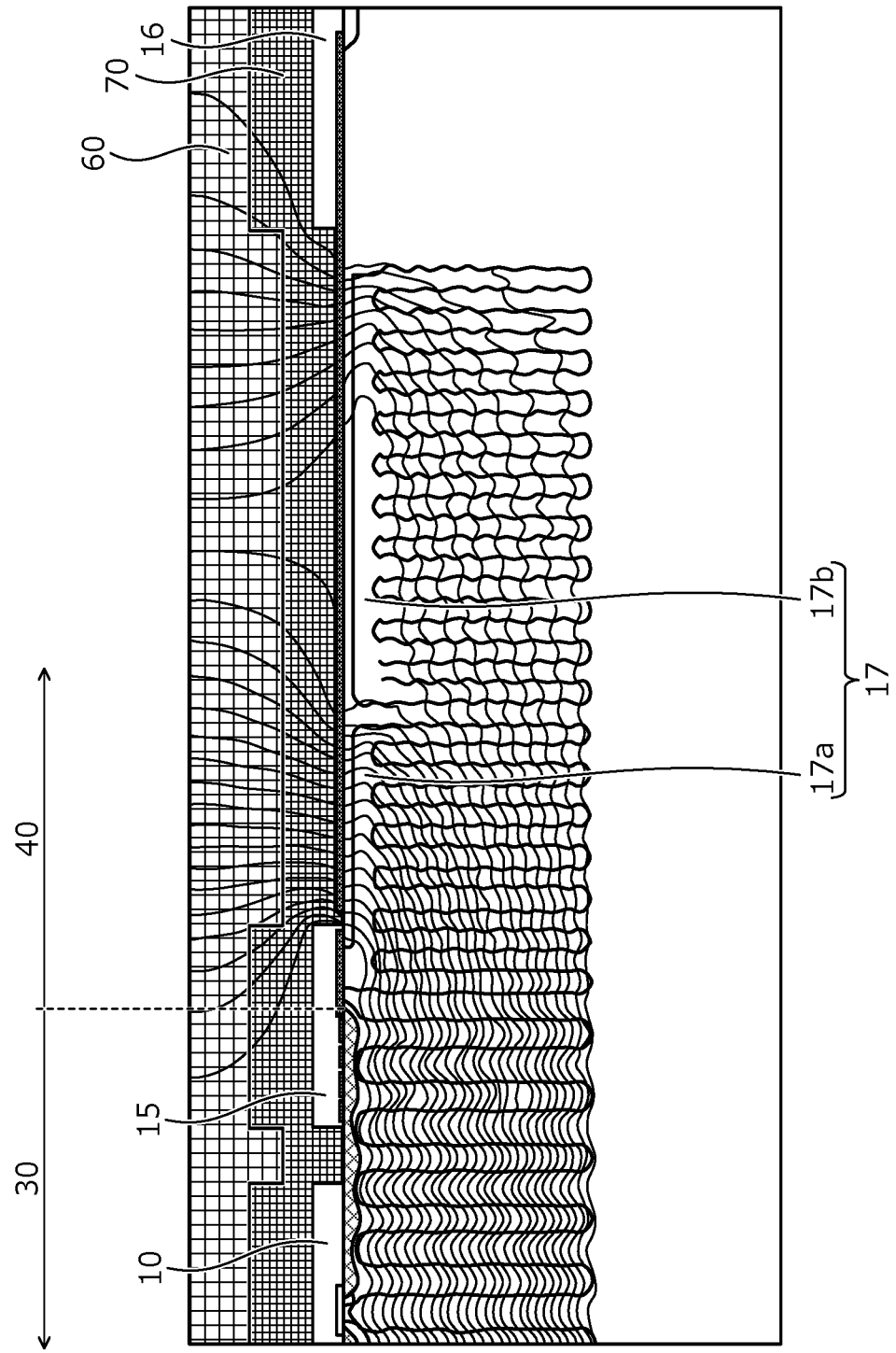

SUPERJUNCTION SEMICONDUCTOR DEVICE INCLUDING PARALLEL PN STRUCTURES AND METHOD OF MANUFACTURING THEREOF

CROSS REFERENCE TO RELATED APPLICATIONS

This application is based upon and claims the benefit of priority of the prior Japanese Patent Application Nos. 2019-076689, filed on Apr. 12, 2019, and 2019-173822, filed on Sep. 25, 2019, the entire contents of which are incorporated herein by reference.

BACKGROUND OF THE INVENTION

1. Field of the Invention

Embodiments of the invention relate to a superjunction semiconductor device and a method of manufacturing a superjunction semiconductor device.

2. Description of the Related Art

In a general vertical n-type-channel metal oxide semiconductor field effect transistor (MOSFET), among plural semiconductor layers formed in a semiconductor substrate, the semiconductor layer having a resistance that is highest is an n-type conductive layer (drift layer). Electrical resistance of this n-type drift layer greatly affects ON resistance of the vertical MOSFET overall. Reduction of the ON resistance of the vertical MOSFET overall may be realized by reducing a thickness of the n-type drift layer and thereby, shortening a current path.

Nonetheless, the vertical MOSFET has a function of sustaining breakdown voltage by the spreading of a depletion layer to the high-resistance n-type drift layer in an OFF state. Therefore, when the n-type drift layer is made thinner to reduce the ON resistance, a distance that the depletion layer spreads during the OFF state decreases, whereby critical electric field strength is easily reached by application of low voltage and the breakdown voltage decreases. On the other hand, to increase the breakdown voltage of the vertical MOSFET, the thickness of the n-type drift layer has to be increased, whereby the ON resistance increases. This type of relationship between the ON resistance and the breakdown voltage is called a tradeoff relationship and in general, it is difficult to enhance both counterparts having a tradeoff relationship. The tradeoff relationship between the ON resistance and the breakdown resistance is known to similarly exist in semiconductor devices such as insulated gate bipolar transistors (IGBTs), bipolar transistors, and diodes.

A superjunction (SJ) structure is known as a structure of a semiconductor device that solves the problems described above. For example, a MOSFET (hereinafter, SJ-MOSFET) having a superjunction structure is known. FIG. 19 is a cross-sectional view of a structure of a conventional SJ-MOSFET.

As depicted in FIG. 19, a SJ-MOSFET 150 uses, as a material, a wafer in which an n-type drift layer 102 is grown on an n$^+$-type semiconductor substrate 101 having a high impurity concentration. P-type column regions 104 penetrating the n-type drift layer 102 from a surface of the wafer and reaching the n$^+$-type semiconductor substrate 101 are provided.

Further, the SJ-MOSFET 150 has a parallel structure (hereinafter, parallel pn region) in which, in the n-type drift layer 102, p-type regions (the p-type column regions 104) and n-type regions (portions of the n-type drift layer 102 between the p-type column regions 104 adjacent to each other; hereinafter, n-type column regions 103) are disposed repeatedly alternating each other in a plane parallel to the main surface of the substrate, the p-type column regions 104 and the n-type column regions 103 extending in a direction orthogonal to a main surface of the substrate and having a narrow width in a plane parallel to the main surface of the substrate. The p-type column regions 104 and the n-type column regions 103 configuring the parallel pn region are regions having impurity concentrations that are increased corresponding to the n-type drift layer 102. In the parallel pn region, concentrations of impurities included in the p-type column regions 104 and the n-type column regions 103 are set to be substantially equal to each other, thereby enabling in the OFF state, creation of a pseudo non-doped layer and facilitation of high breakdown voltage.

Plural p-type base regions 105 are provided on the parallel pn region in an active region 130 of the SJ-MOSFET 150, the active region 130 in which an element is formed and through which current flows during an ON state. In the p-type base regions 105, n$^+$-type source regions 106 are provided. Further, a gate insulating film 107 is provided spanning respective surfaces of the p-type base regions 105 and the n-type column regions 103. Gate electrodes 108 are provided on a surface of the gate insulating film 107 and an insulating film 113 is provided so as to cover the gate electrodes 108. Further, a source electrode 110 is provided on the n$^+$-type source regions 106 and a drain electrode 114 is provided on a back surface of the n$^+$-type semiconductor substrate 101.

In an edge termination region 140 of the SJ-MOSFET 150, similarly to the active region 130, the parallel pn region and the insulating film 113 are provided in the n-type drift layer 102. The edge termination region 140 surrounds a periphery of the active region 130. The drain electrode 114 is provided on the back surface of the n$^+$-type semiconductor substrate 101.

Further, in a power semiconductor element, the breakdown voltage has to be sustained in the edge termination region 140 similarly to the active region 130. As a commonly known technique to obtain high breakdown voltage in the edge termination region 140, structures configuring a field plate, RESURF, a guard ring, etc. are known. FIG. 19 depicts the SJ-MOSFET 150 having a RESURF structure. In the SJ-MOSFET 150, when the breakdown voltage is sustained, a RESURF region 117 is partially or completely depleted, thereby enabling electric field concentration in the edge termination region 140 to be mitigated. Further, the RESURF region 117 may be connected to the parallel pn region. In this case, the depletion layer spreads from a junction part of the parallel pn region connected to the RESURF region 117 and the drift layer is depleted completely by a low voltage. A high breakdown voltage is established by the formation of a depletion layer when, accompanying a voltage increase, the parallel pn region achieves a guard ring effect, a depletion layer further spreads from the adjacent parallel pn region, and these depletion layers merge and are completely depleted.

For example, a semiconductor device is commonly known in which in a SJ-MOSFET that includes an n-type pillar layer and a p-type pillar layer in an element portion and an n-type pillar layer and a p-type pillar layer in an element termination portion, a high-resistance n$^-$-type layer is provided on respective upper surfaces of the n-type pillar layer and the p-type pillar layer of the element termination portion, and an outermost p-type pillar layer is included between the n-type pillar layer and the high-resistance n⁻-type layer of the element portion. Further, at a border between the element portion and the element termination portion, a p-type base layer is provided and a RESURF layer is provided adjacent to the p-type base layer (for example, refer to Japanese Laid-Open Patent Publication No. 2006-5275).

Further, a semiconductor device is commonly known in which in a SJ-MOSFET in which a pitch at which a second parallel pn layer of an element peripheral edge portion repeats is less than a pitch at which a first parallel pn layer of a center portion of an element active portion repeats, a p base region is included spanning plural first p-type regions and second p-type regions at a border between the first parallel pn layer and the second parallel pn layer. An n⁻ surface region that surrounds the first parallel pn layer is provided between the second parallel pn layer and a first main surface. Further, on a first main side of the n⁻ surface region, two or more p-type guard ring regions are provided separated from each other (for example, refer to Japanese Laid-Open Patent Publication No. 2013-149761).

Further, a semiconductor device is commonly known in which p-type pillar regions of a peripheral region are in contact with p-type connection regions and the p-type connection regions are in ohmic contact with a source electrode via a body region. Between the p-type connection regions and a first main surface, an n-type depletable semiconductor region is provided. The n-type depletable semiconductor region has a doping concentration that is higher than that of a low-doping semiconductor region between an end of a pn column and a field stopper region that is provided in an outermost periphery (for example, refer to U.S. Pat. No. 9,281,392)

SUMMARY OF THE INVENTION

According to an embodiment, a superjunction semiconductor device has an active region through which current flows and a termination structure region having a voltage withstanding structure disposed at an outer side of the active region and surrounding a periphery of the active region. The superjunction semiconductor device includes a semiconductor substrate of a first conductivity type, having a front surface and a back surface opposite to the front surface; a first semiconductor layer of the first conductivity type, provided on the front surface of the semiconductor substrate and having an impurity concentration lower than an impurity concentration of the semiconductor substrate; a first parallel pn structure provided on an upper surface of the first semiconductor layer in the active region and including a plurality of first columns of the first conductivity type and a plurality of second columns of a second conductivity type, the first columns and the second columns being disposed to repeatedly alternate with one another on a plane parallel to the front surface; a second parallel pn structure provided on the upper surface of the first semiconductor layer in the termination structure region and including a plurality of third columns of the first conductivity type and a plurality of fourth columns of the second conductivity type, the third columns and the fourth columns being disposed repeatedly to alternate with one another on a plane parallel to the front surface; a first semiconductor region of the second conductivity type, provided on a surface of the second parallel pn structure in the termination structure region, the first semiconductor region including a plurality of regions apart from each other; a plurality of second semiconductor regions of the second conductivity type, each of which is provided on a surface of one or more of the plurality of second columns and has a first side facing the semiconductor substrate and a second side opposite to the first side, each of the second semiconductor regions having a surface layer; a third semiconductor region of the first conductivity type selectively provided in the surface layer of each of the second semiconductor regions; a gate insulating film in contact with the second semiconductor regions and having a first surface in contact with the second semiconductor regions and a second surface opposite to the first surface; and a gate electrode provided on the second surface of the gate insulating film.

In the embodiment, the first semiconductor region includes a first region and a second region, the first region being apart from the second region and closer to the active region than is the second region.

In the embodiment, a ratio of respective widths of the first and second regions in a direction parallel to the front surface of the semiconductor substrate is in a range from 3:7 to 5:5.

In the embodiment, the first region and the second region each has an annular planar shape.

In the embodiment, in a direction parallel to the front surface of the semiconductor substrate, a width of each of the plurality of first columns and a width of each of the plurality of second columns of the first parallel pn structure in the active region are greater than a width of each of the plurality of third columns and a width of each of the plurality of fourth columns of the second parallel pn structure in the termination structure region.

In the embodiment, the superjunction semiconductor device further includes a fourth semiconductor region of the first conductivity type on a surface at a first side of the first semiconductor region opposite to a second side of the first semiconductor region that faces the front surface of the semiconductor substrate.

In the embodiment, the first semiconductor region includes a first region, a second region positioned further from the active region than is the first region, a third region positioned further from the active region than is the second region, and a fourth region positioned further from the active region than is the third region.

In the embodiment, in a direction parallel to the front surface of the semiconductor substrate, a width w1 of the first region, a width w2 of the second region, a width w3 of the third region, and a width w4 of the fourth region satisfy w1≤w2≤w3≤w4.

In the embodiment, the superjunction semiconductor device further includes an electrode provided in the termination structure region. The first region, the second region, the third region, and the fourth region are electrically connected to the electrode via one of the plurality of second semiconductor regions.

In the embodiment, the second parallel pn structure includes an inner structure having a first group of fourth columns among the plurality of fourth columns, and an outer structure positioned further from the active region than is the inner structure and having a second group of fourth columns among the plurality of fourth columns. In a direction orthogonal to the front surface of the semiconductor substrate, a distance from the upper surface of the first semiconductor layer to a bottom of each of the second group of fourth columns among the plurality of fourth columns of the outer structure is less than or equal to a distance from the upper surface of the first semiconductor layer to a bottom of each of the first group of fourth columns among the plurality of fourth columns of the inner structure.

In the embodiment, at least one among the first region, the second region, the third region, and the fourth region has an impurity concentration that increases with proximity of the at least one to the active region.

In the embodiment, at least one among the first region, the second region, the third region, and the fourth region has a first part near the active region, a second part positioned further from the active region than is the first part, and a third part positioned further from the active region than is the second part. An impurity concentration D1 of the first part, an impurity concentration D2 of the second part, and an impurity concentration D3 of the third part have ranges of ratios satisfying D1:D2=1.5:1 to 1.2:1 and D2:D3=1:0.75 to 1:0.5.

In the embodiment, each of the first to third parts has an upper surface. The first semiconductor region has a center plane that is parallel to the front surface of the semiconductor substrate. In a direction orthogonal to the front surface of the semiconductor substrate, a distance d1 from the upper surface of the first part to the center plane of the first semiconductor region, a distance d2 from the upper surface of the second part to the center plane of the first semiconductor region, and a distance d3 from the upper surface of the third part to the center plane of the first semiconductor region satisfy d1>d2>d3.

According to another embodiment a method of manufacturing a superjunction semiconductor device having an active region through which current flows and a termination structure region having a voltage withstanding structure disposed at an outer side of the active region and surrounding a periphery of the active region, the method includes in a first process, forming a first semiconductor layer of a first conductivity type on a front surface of a semiconductor substrate of the first conductivity type, an impurity concentration of the first semiconductor layer being lower than an impurity concentration of the semiconductor substrate; in a second process, forming, in the active region of the first semiconductor layer, a first parallel pn structure including a plurality of first columns of the first conductivity type and a plurality of second columns of a second conductivity type, the first columns and the second columns being disposed to repeatedly alternate with one another on a plane parallel to the front surface, and forming, in the termination structure region of the first semiconductor layer, a second parallel pn structure including a plurality of third columns of the first conductivity type and a plurality of fourth columns of the second conductivity type, the third columns and the fourth columns being disposed to repeatedly alternate with one another on a plane parallel to the front surface; in a third process, forming, in the active region, a second first parallel pn structure on a surface of the first parallel pn structure formed in the second process and forming, in the termination structure region, a first semiconductor region of the second conductivity type on a surface of the second parallel pn structure, the first semiconductor region including a plurality of regions apart from one another; in a fourth process, forming a plurality of second semiconductor regions of the second conductivity type each of which is formed on a surface of one or more of the plurality of second columns of the first parallel pn structure in the active region and has a first side facing toward the semiconductor substrate and a second side opposite to the first side, each of the second semiconductor regions having a surface layer; in a fifth process, selectively forming a third semiconductor region of the first conductivity type in the surface layer of each of the second semiconductor regions; in a sixth process, forming a gate insulating film in contact with the second semiconductor regions, the gate insulating film having a first surface in contact with the second semiconductor regions and a second surface opposite to the first surface; and in a seventh process, forming a gate electrode on the second surface of the gate insulating film.

In the embodiment, in the third process, the second first parallel pn structure and the first semiconductor region are formed concurrently by epitaxial growth and an ion implantation.

In the embodiment, a first opening width of a photoresist of the ion implantation when forming the second parallel pn structure is greater than a second opening width of the photoresist of the ion implantation when forming the first semiconductor region.

In the embodiment, in the third process, an impurity is implanted in a plurality of areas by the ion implantation and the implanted impurity is diffused by a heat treatment to form the first semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a cross-sectional view depicting a state of electric potential distribution inside a SJ-MOSFET of a comparison example.

FIG. 7A is a cross-sectional view depicting a state of electric potential distribution inside the SJ-MOSFET according to the first embodiment.

FIG. 7B is a diagram depicting a state of electric potential distribution inside the SJ-MOSFET according to the second embodiment.

DETAILED DESCRIPTION OF THE INVENTION

Figure 1:
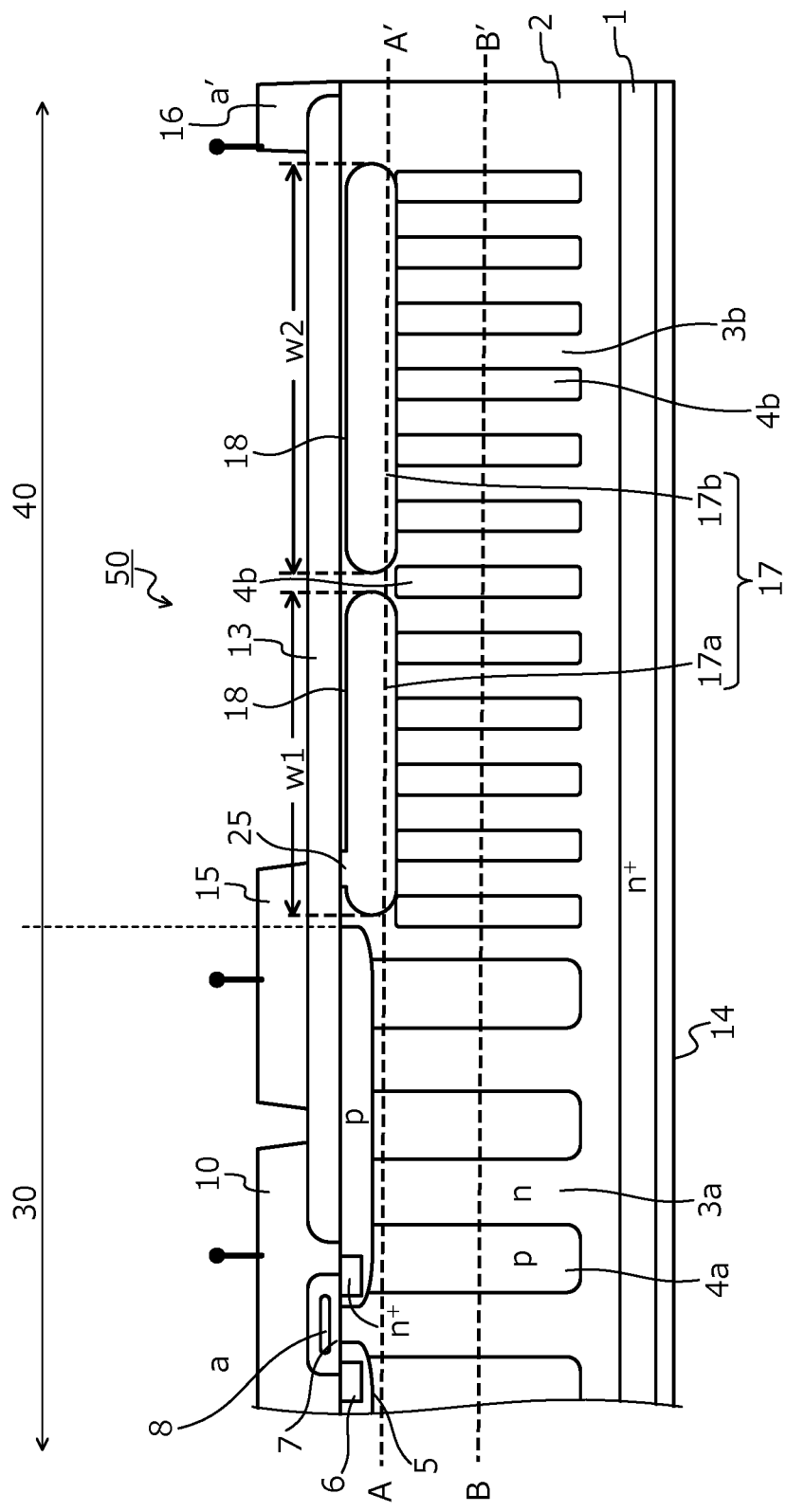
FIG. 1 is a cross-sectional view of a structure of a SJ-MOSFET according to a first embodiment.

First, problems associated with the conventional techniques will be discussed. In the parallel pn region, when an impurity amount of the n-type column regions 103 is substantially equal to an impurity amount of the p-type column regions 104 (state in which a charge balance is "1"), the breakdown voltage of the SJ-MOSFET 150 has a maximum value. Nonetheless, due to manufacturing variation of the semiconductor device, the impurity amount of the parallel pn region is susceptible to variation. As a result, the charge balance becomes biased and decreases in breakdown voltage easily occur. Furthermore, with the addition of variations in an impurity amount and diffusion depth of the impurity of the RESURF region 117, decreases in the breakdown voltage tend to further occur. As a result, a problem arises in that individuals having an element breakdown voltage that is low easily occur.

Embodiments of a superjunction semiconductor device and a method of manufacturing a superjunction semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 2:
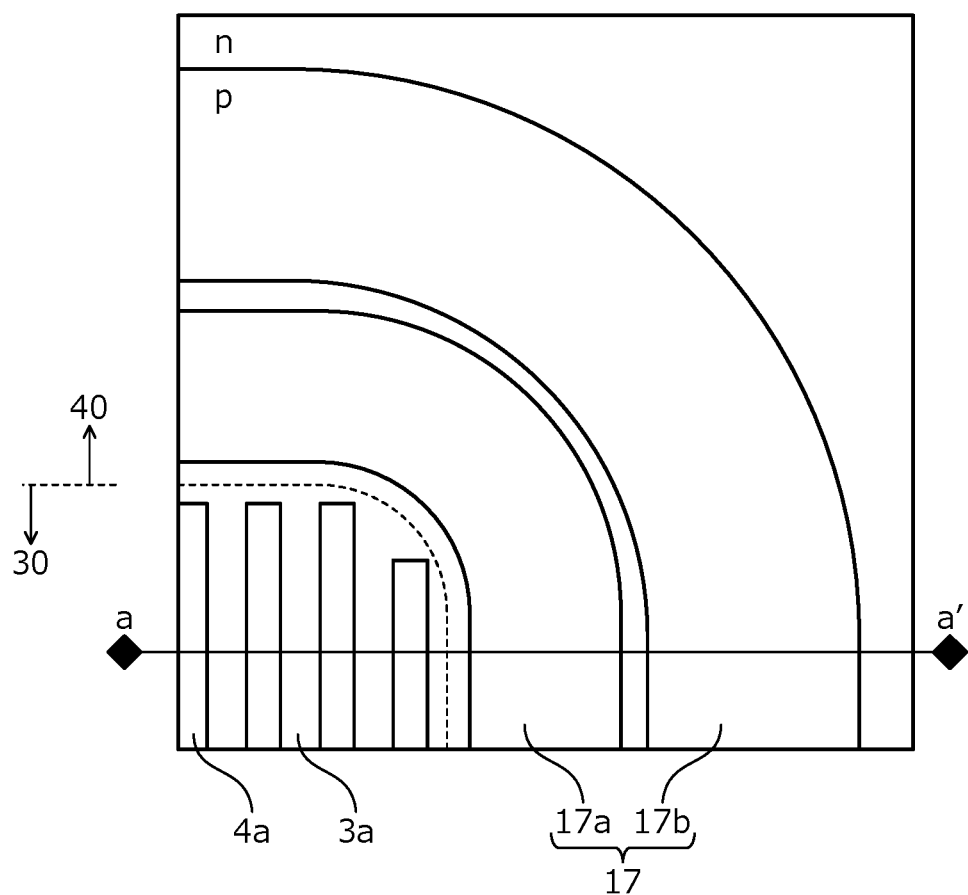
FIG. 2 is a plan view of a portion along plane A-A' in FIG. 1 depicting the structure of the SJ-MOSFET according to the first embodiment.
Figure 3:
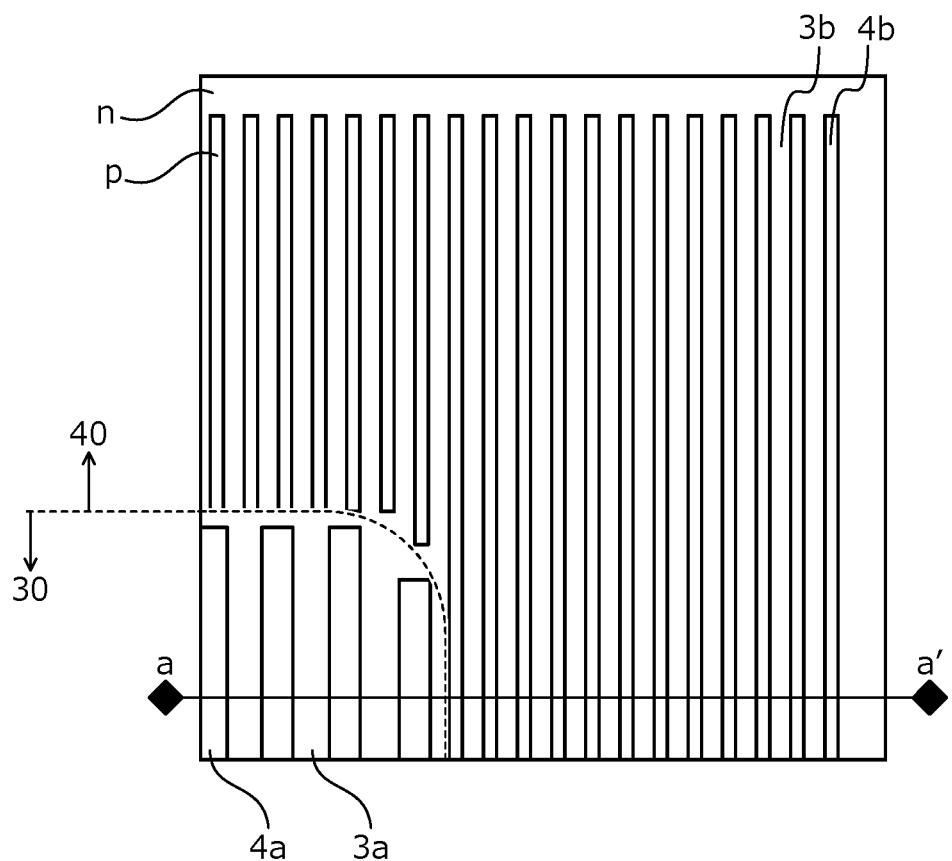
FIG. 3 is a plan view of a portion along plane B-B' in FIG. 1 depicting the structure of the SJ-MOSFET according to the first embodiment.
Figure 4:
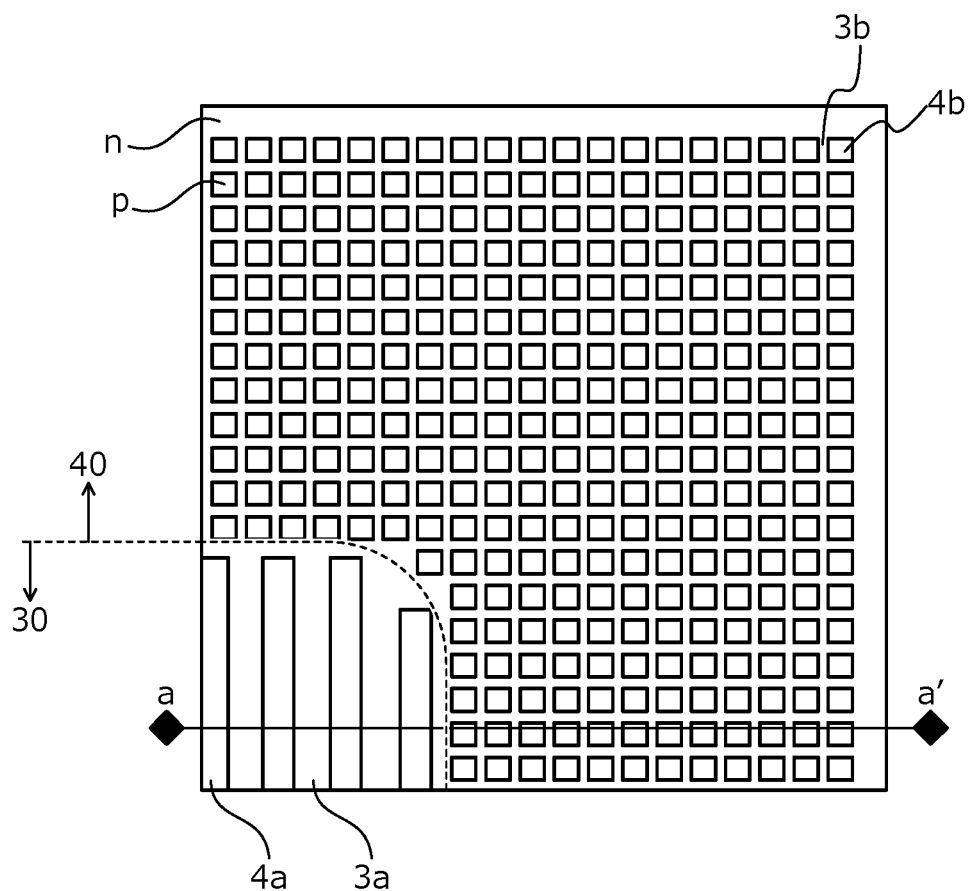
FIG. 4 is a plan view of another example of a portion along plane B-B' in FIG. 1 depicting the structure of the SJ-MOSFET according to the first embodiment.

A superjunction semiconductor device according to the present invention will be described taking a SJ-MOSFET as an example. FIG. 1 is a cross-sectional view of a structure of a SJ-MOSFET according to a first embodiment. FIG. 2 is a plan view of a portion along plane A-A' in FIG. 1 depicting the structure of the SJ-MOSFET according to the first embodiment. Further, FIG. 3 is a plan view of a portion along plane B-B' in FIG. 1 depicting the structure of the SJ-MOSFET according to the first embodiment. Further, FIG. 4 is a plan view of another example of a portion along plane B-B' in FIG. 1 depicting the structure of the SJ-MOSFET according to the first embodiment. FIG. 1 is a cross-sectional view of a portion along cutting line a-a' in FIGS. 2 to 4.

The SJ-MOSFET depicted in FIG. 1 is a SJ-MOSFET 50 that includes metal oxide semiconductor (MOS) gates on a front side (side having p-type base regions 5 described hereinafter) of a semiconductor base (silicon base: semiconductor chip) containing silicon (Si). The SJ-MOSFET 50 includes an active region 30 and an edge termination region 40 surrounding a periphery of the active region 30. The active region 30 is a region through which current flows in an ON state. The edge termination region 40 is a region that mitigates electric field on a base-front-side of a drift region and that sustains breakdown voltage. In the active region 30 depicted in FIG. 1, only one unit cell (functional unit of an element) is depicted and other unit cells adjacent to this unit cell are not depicted. A border between the active region 30 and the edge termination region 40 is an end of one of the p-type base regions 5.

An $n^+$-type semiconductor substrate (semiconductor substrate of a first conductivity type) 1 is a silicon single crystal substrate doped with, for example, phosphorus (P). An n-type drift layer (first semiconductor layer of the first conductivity type) 2 is a low-concentration, n-type drift layer doped with, for example, phosphorus and having an impurity concentration lower than an impurity concentration of the $n^+$-type semiconductor substrate 1. Hereinafter, the $n^+$-type semiconductor substrate 1 and the n-type drift layer 2 collectively are the semiconductor base. On the front side of the semiconductor base, a MOS gate structure (element structure) is formed. Further, a drain electrode 14 is provided on a back surface of the semiconductor base.

In the active region 30 of the SJ-MOSFET 50, a first parallel pn region is provided. In the first parallel pn region, n-type column regions 3a and p-type column regions 4a are disposed repeatedly alternating each other. The p-type column regions 4a are provided from a surface of the n-type drift layer 2 so as to not reach a surface of the $n^+$-type semiconductor substrate 1. As depicted in FIGS. 2 to 4, a planar shape of each of the n-type column regions 3a and each of the p-type column regions 4a in the active region 30 is a shape of a stripe.

Further, the p-type base regions (second semiconductor region of a second conductivity type) 5 are selectively provided in a surface layer of the n-type drift layer 2 and are in contact with the p-type column regions 4a. In a surface layer of each of the p-type base regions 5, $n^+$-type source regions (third semiconductor region of the first conductivity type) 6 are selectively provided. On surfaces of the p-type base regions 5, at portions thereof each sandwiched between one of the $n^+$-type source regions 6 and one of the n-type column regions 3a, gate electrodes 8 are respectively provided via a gate insulating film 7. The gate electrodes 8 may be provided on surfaces of the n-type column regions 3a via the gate insulating film 7.

An insulating film 13 is provided on the front side of the semiconductor base so as to cover the gate electrodes 8. A source electrode 10 is in contact with the $n^+$-type source regions 6 and the p-type base regions 5 via contact holes opened in an interlayer insulating film (not depicted) and is electrically connected to the $n^+$-type source regions 6 and the p-type base regions 5.

The source electrode 10 is electrically insulated from the gate electrodes 8 by the insulating film 13. On the source electrode 10, a protective film (not depicted) such as a passivation film containing, for example, a polyimide is selectively provided.

A field plate electrode 15 is disposed further outward (closer to the edge termination region 40) than is the source electrode 10 and is separated from the source electrode 10. Further, the field plate electrode 15 is provided in a substantially annular shape along the border between the active region 30 and the edge termination region 40. The field plate electrode 15 may serve as gate wiring electrically connecting the gate electrodes 8.

In the edge termination region 40 of the SJ-MOSFET 50, a second parallel pn region is further provided. As depicted in FIG. 3, a planar shape of individual n-type column regions 3b and individual p-type column regions 4b in the edge termination region 40 may be a shape of a stripe or as depicted in FIG. 4, the planar shape of individual n-type column regions 3b and individual p-type column regions 4b in the edge termination region 40 may be rectangular.

Further, as depicted in FIGS. 1 to 4, a width of individual n-type column regions 3a and a width of individual p-type column regions 4a in the active region 30 are respectively wider than a width of individual n-type column regions 3b and a width of individual p-type column regions 4b in the edge termination region 40. As a result, an impurity concentration of a second parallel pn structure in the edge termination region 40 may be set lower than an impurity concentration of the first parallel pn region in the active region 30. Therefore, the breakdown voltage of the edge termination region 40 may be set higher than the breakdown voltage of the active region 30.

On an outer peripheral side of the second parallel pn region, the n-type drift layer 2 may be provided so as to surround the second parallel pn region and an n$^+$-type region (not depicted) that functions as a channel stopper may be provided in the n-type drift layer 2. A RESURF region (first semiconductor region of the second conductivity type) 17 is provided on a surface of the second parallel pn region. The insulating film 13 is provided on respective surfaces of the RESURF region 17 and the n-type drift layer 2. Further, a stopper electrode 16 is provided on a surface of the n$^+$-type region.

As depicted in FIGS. 1 and 2, in the first embodiment, the RESURF region 17 extends in a direction of the stopper electrode 16 and underlies, in a plan view, an outer end (end nearest an end of the semiconductor chip) of the field plate electrode 15 and is divided into at least two regions. In the example depicted in FIG. 1, the RESURF region 17 is divided into two regions, a first RESURF region 17a that is near the active region 30 and a second RESURF region 17b that is separated from the active region 30.

As depicted in FIG. 2, the first RESURF region 17a and the second RESURF region 17b have an annular planar shape. Further, the first RESURF region 17a and the second RESURF region 17b are electrically connected to the p-type column regions 4b of the second parallel pn region. Further, as depicted in FIG. 1, of the p-type column regions 4b, a p-type column region not connected to the first RESURF region 17a or the second RESURF region 17b may be disposed between the first RESURF region 17a and the second RESURF region 17b.

Further, an n-type region (fourth semiconductor region) 18 is provided sandwiched by the insulating film 13 above both the first RESURF region 17a and the second RESURF region 17b, and the first RESURF region 17a and the second RESURF region 17b. An end 25 of the first RESURF region 17a nearest the active region 30 may be in contact with the insulating film 13. Further, the end 25 of the first RESURF region 17a may be electrically connected to the field plate electrode 15. The end 25 of the first RESURF region 17a may be provided in an annular shape.

As described above, when the breakdown voltage is sustained, the RESURF region 17 partially or completely depletes, thereby enabling electric field concentration of the edge termination region 40 to be mitigated. Division of the RESURF region 17 enables electric potential in the RESURF region 17 to be mutually shared, whereby electric field strength increases locally. Therefore, when the charge balance has a p-type impurity bias in the second parallel pn region or when the concentration of the p-type impurity in the RESURF region 17 increases due to manufacturing variation, the RESURF region 17b near the stopper electrode 16 becomes a buffer, thereby enabling sharp decreases in the breakdown voltage to be mitigated. Therefore, it becomes possible to suppress decreases in the breakdown voltage with respect to manufacturing variation.

Figure 5:
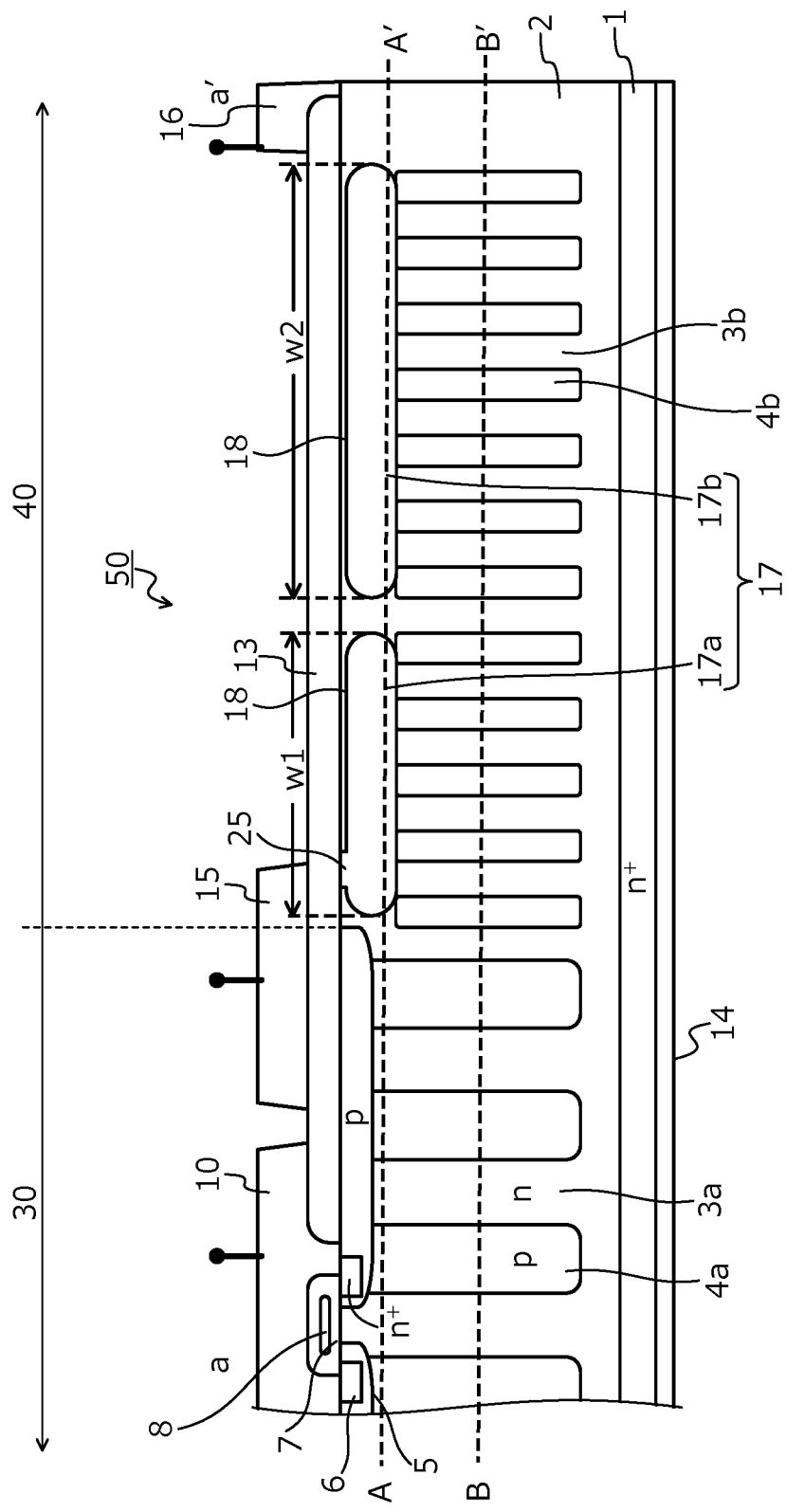
FIG. 5 is a cross-sectional view of a structure the SJ-MOSFET according to a second embodiment.

FIG. 5 is a cross-sectional view of a structure the SJ-MOSFET according to a second embodiment. A portion along plane A-A' in FIG. 5 is similar to the plan view of the structure of the SJ-MOSFET according to the first embodiment depicted in FIG. 2. Further, a plane view of a portion along plane B-B' in FIG. 5 depicting the structure of the SJ-MOSFET according to the second embodiment is similar to the plan view of the structure of the SJ-MOSFET according to the first embodiment depicted in FIG. 3. Further, a plan view of another example of the portion along plane B-B' in FIG. 5 depicting the structure of the SJ-MOSFET according to the second embodiment is similar to the plan view depicted in FIG. 4.

The second embodiment differs from the first embodiment in that of the p-type column regions 4b, a p-type column region not connected to the first RESURF region 17a or the second RESURF region 17b is not disposed between the first RESURF region 17a and the second RESURF region 17b.

The second embodiment may obtain effects similar to those of the first embodiment even when, among the p-type column regions 4b, a p-type column region not connected to the first RESURF region 17a or the second RESURF region 17b is not disposed between the first RESURF region 17a and the second RESURF region 17b.

Further, in the one SJ-MOSFET 50, a portion in which a p-type column region 4b not connected to the first RESURF region 17a or the second RESURF region 17b is disposed between the first RESURF region 17a and the second RESURF region 17b depicted in FIG. 1 and a portion in which a p-type column region 4b not connected to the first RESURF region 17a or the second RESURF region 17b is not disposed between the first RESURF region 17a and the second RESURF region 17b depicted in FIG. 5 may both be present.

However, when both are present, the first RESURF region 17a and the second RESURF region 17b are separated from each other. Further, a width w1 of the first RESURF region 17a and a width w2 of the second RESURF region 17b separated from the active region 30 satisfy a relationship described hereinafter.

Further, the SJ-MOSFET 50 depicted in FIG. 1 is used in a form sealed by a sealing resin such as a casting resin. When adhesion between the sealing resin and the SJ-MOSFET 50 is insufficient, an ionic substance such as moisture may enter between the sealing resin and the SJ-MOSFET 50. In this case, charge accumulates on the protective film of the SJ-MOSFET 50.

FIG. 6 is a cross-sectional view depicting a state of electric potential distribution inside a SJ-MOSFET of a comparison example. The SJ-MOSFET of the comparison example differs from the SJ-MOSFET according to the first embodiment in that the RESURF region 117 is not divided into the first RESURF region 17a and the second RESURF region 17b. As depicted in FIG. 6, when the RESURF region 117 is not divided, equipotential lines 60 are lined up substantially evenly on the RESURF region 117. In this state, when charge accumulates on a surface protective film 70, the equipotential lines 60 move inward (toward the active region 30) or outward (toward the stopper electrode 16). For example, when positive charge accumulates, the charge moves inward and when negative charge accumulates, the charge moves outward. In this case, a region where the equipotential lines 60 are dense occurs at an end of the RESURF region 117 and the breakdown voltage fluctuates.

FIG. 7A is a cross-sectional view depicting a state of electric potential distribution inside the SJ-MOSFET according to the first embodiment. As depicted in FIG. 7A, when the RESURF region 17 is divided, an interval between the equipotential lines 60 widens at a point of division. In this state, even when charge accumulates on the surface protective film 70 and the equipotential lines 60 move inward or outward, movement of the equipotential lines 60 is stopped at the point of division. As a result, effects due to the charge may be localized. Therefore, fluctuation of the breakdown voltage when charge accumulates on the protective film of the semiconductor device may be suppressed. Further, since movement of the equipotential lines 60 stops at the point of division, the fluctuation of the breakdown voltage when charge accumulates may be further suppressed with each additional division of the RESURF region 17.

FIG. 7B is a diagram depicting a state of electric potential distribution inside the SJ-MOSFET according to the second embodiment. As depicted in FIG. 7B, effects similar to those in FIG. 7A may be obtained.

Further, as depicted in FIGS. 1 and 5, when the RESURF region 17 is divided into two regions, a ratio of the width w1 of the first RESURF region 17a near the active region 30 to the width w2 of the second RESURF region 17b separated from the active region 30 may be within a range from 3:7 to 5:5. Here, the width w1 of the first RESURF region 17a is a length from an inner side to an outer side of the first RESURF region 17a and similarly for the width w2 of the second RESURF region 17b. In other words, the range may be from an instance where the width w1 of the first RESURF region 17a is 3 and the width w2 of the second RESURF region 17b is 7 to an instance where the width w1 of the first RESURF region 17a is 5 and the width w2 of the second RESURF region 17b is 5.

To sustain the breakdown voltage, while complete depletion of the RESURF region is desirable, the breakdown voltage may be sustained even when the RESURF region is partially depleted. As depicted in FIGS. 7A and 7B, when the first RESURF region 17a near the active region 30 is depleted, the interval between the equipotential lines 60 tends to widen as compared to an instance where the RESURF region 117 is completely depleted as depicted in FIG. 6. Further, the interval between the equipotential lines 60 becomes narrower (becomes denser) in a region between the first RESURF region 17a and the second RESURF region 17b. As a result, the interval between the equipotential lines 60 of the second RESURF region 17b widens and therefore, electric field is mitigated. The electric field is mitigated on a side near the stopper electrode 16, thereby enabling suppression of decreases in the breakdown voltage due to surface charge.

Furthermore, when the RESURF region 17 is divided into two regions, to minimize decreases in the breakdown voltage due to surface charge, the width w1 of the first RESURF region 17a that is near the active region 30 may be less than the width w2 of the second RESURF region 17b separated from the active region 30. Further, when the RESURF region 17 is divided into three or more regions, to minimize decreases in the breakdown voltage due to surface charge, a width of a RESURF region nearest the stopper electrode 16 may be greatest among the three or more regions.

Further, the n-type region 18 is provided between the RESURF region 17 and the insulating film 13, thereby enabling fluctuation of the breakdown voltage of the edge termination region 40 due to surface charge to be further stabilized. Further, instances of holes (positive holes) entering the insulating film 13 may be reduced by the n-type region 18.

Figure 8:
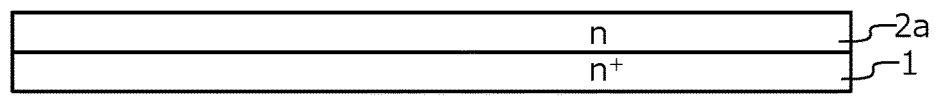
FIG. 8 is a cross-sectional view of the SJ-MOSFET according to the first and the second embodiments during manufacture.

A method of manufacturing the superjunction semiconductor device according to the first and the second embodiments will be described. FIGS. 8, 9, 10, 11, 12, and 13 are cross-sectional views of the SJ-MOSFET 50 according to the first and the second embodiments during manufacture. First, the n$^+$-type semiconductor substrate 1 containing silicon and forming an n$^+$-type drain layer is prepared. Next, on the front surface of the n$^+$-type semiconductor substrate 1, an n-type layer 2a having an impurity concentration lower than an impurity concentration of the n$^+$-type semiconductor substrate 1 is formed by epitaxial growth. The state up to here is depicted in FIG. 8.

The n-type layer 2a may be formed by epitaxial growth by doping an n-type impurity so that the impurity concentration of the n-type layer 2a, for example, is in a range from $1.0 \times 10^{14}/cm^3$ to $1.0 \times 10^{17}/cm^3$.

Figure 9:
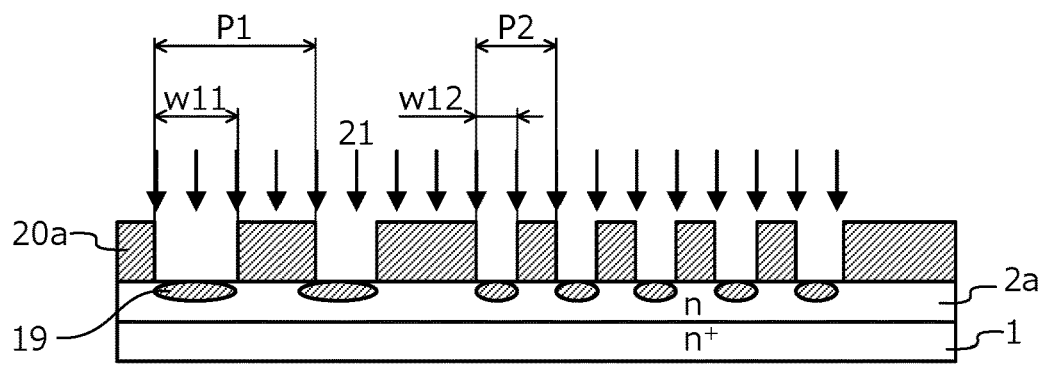
FIG. 9 is a cross-sectional view of the SJ-MOSFET according to the first and the second embodiments during manufacture.

Next, on the surface of the n-type layer 2a, an ion implantation mask 20a having openings of predetermined widths is formed by a photolithographic technique, for example, using a photoresist. Here, a width w11 and a pitch P1 of the openings in the active region are wider than a width w12 and a pitch P2 of openings in the edge termination region. An ion implantation 21 of a p-type impurity, for example, boron (B), is performed using the ion implantation mask 20a as a mask, thereby forming p-type regions 19 in a surface layer of the n-type layer 2a. The state up to here is depicted in FIG. 9. Next, the ion implantation mask 20a is removed.

Next, an n-type layer 2b having an impurity concentration about equal to an impurity concentration of the n-type layer 2a is formed on a front side of the n-type layer 2a by epitaxial growth. Next, on the surface of the n-type layer 2b, the ion implantation mask 20a having openings of predetermined widths is formed by a photolithographic technique, for example, using a photoresist. Here, the width w11 and the pitch P1 of the openings in the active region are wider than the width w12 and the pitch P2 of the openings in the edge termination region. The ion implantation 21 of a p-type impurity, for example, boron (B), is performed using the ion implantation mask 20a as a mask, thereby forming the p-type regions 19 in a surface layer of the n-type layer 2b. Next, the ion implantation mask 20a is removed.

Next, on a front side of the n-type layer 2b, an n-type layer 2c having an impurity concentration that is about equal to the impurity concentration of the n-type layer 2b is formed by epitaxial growth. Next, on the surface of the n-type layer 2c, the ion implantation mask 20a having openings of predetermined widths is formed by a photolithographic technique, for example, using a photoresist. Here, the width w11 and the pitch P1 of the openings in the active region are wider than the width w12 and the pitch P2 of the openings in the edge termination region. The ion implantation 21 of a p-type impurity, for example, boron (B), is performed using the ion implantation mask 20a as a mask, thereby forming the p-type regions 19 in a surface layer of the n-type layer 2c. Next, the ion implantation mask 20a is removed.

Next, on a front side of the n-type layer 2c, an n-type layer 2d having an impurity concentration that is about equal to the impurity concentration of the n-type layer 2c is formed by epitaxial growth. Next, on the surface of the n-type layer 2d, the ion implantation mask 20a having openings of predetermined widths is formed by a photolithographic technique, for example, using a photoresist. Here, the width w11 and the pitch P1 of the openings in the active region are wider than the width w12 and the pitch P2 of the openings in the edge termination region. The ion implantation 21 of a p-type impurity, for example, boron (B), is performed using the ion implantation mask 20a as a mask, thereby forming the p-type regions 19 in a surface layer of the n-type layer 2d. As a result, lower first and second parallel pn regions formed by the n-type layer 2a to the n-type layer 2d and the p-type regions 19 are formed. The state up to here is depicted in FIG. 10.

Figure 10:
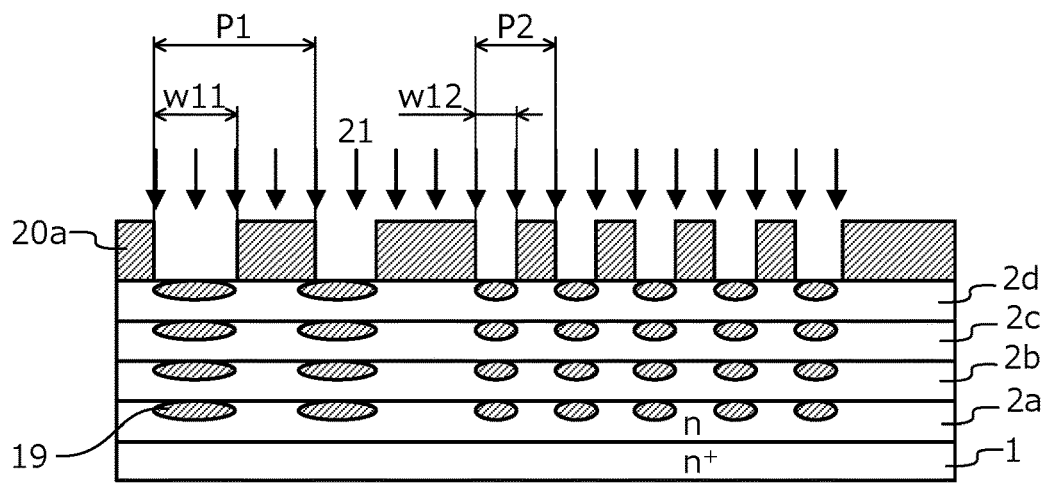
FIG. 10 is a cross-sectional view of the SJ-MOSFET according to the first and the second embodiments during manufacture.

In the example depicted in FIG. 10, while an example is depicted in which ion implantation and epitaxial growth are performed repeatedly four times, without limitation hereto, the number of times that the ion implantation and the epitaxial growth are performed may be suitably changed according to targeted characteristics such as breakdown voltage.

Figure 11:
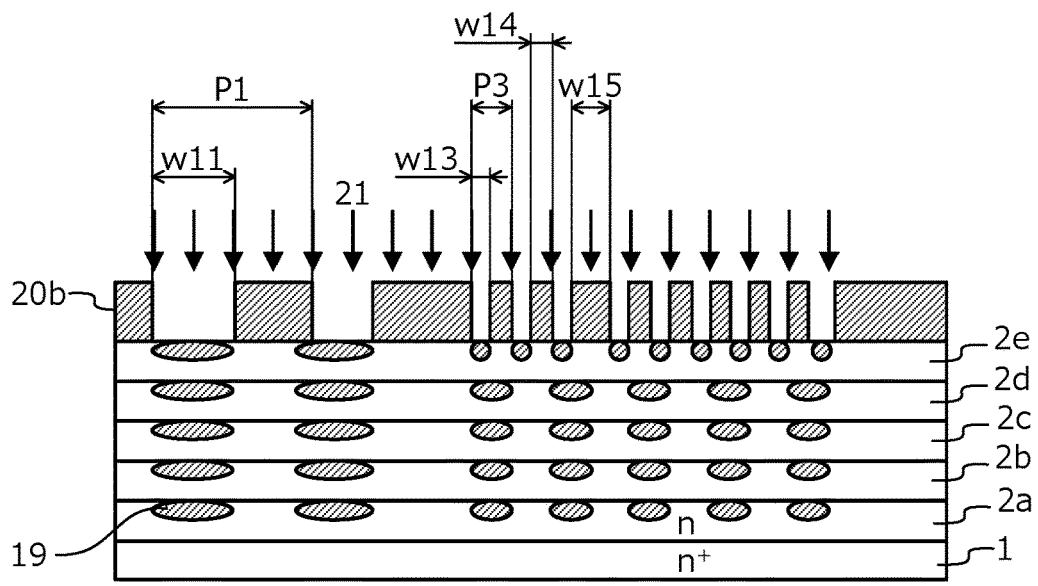
FIG. 11 is a cross-sectional view of the SJ-MOSFET according to the first and the second embodiments during manufacture.

Next, the ion implantation mask 20a is removed. Next, on a front side of the n-type layer 2d, an n-type layer 2e having an impurity concentration about equal to the impurity concentration of the n-type layer 2d is formed by epitaxial growth. Next, on the surface of the n-type layer 2e, an ion implantation mask 20b having openings of predetermined widths is formed by a photolithographic technique, for example, using a photoresist. Here, a width w13 and a pitch P3 of the openings in the edge termination region are narrower than the width w12 and the pitch P2 of the openings of the masks formed on the n-type layer 2a to the n-type layer 2d in the edge termination region. Further, a width w15 of the photoresist where the RESURF region 17 is separated into the first RESURF region 17a and the second RESURF region 17b is wider than a width w14 (=P3−w13) of the photoresist in edge termination region. The ion implantation 21 of a p-type impurity, for example, boron (B), is performed using the ion implantation mask 20b as a mask, thereby forming the p-type regions 19 in the n-type layer 2e. As a result, upper first parallel pn regions formed by the n-type layer 2e and the p-type regions 19 are formed in the active region 30 and the RESURF region 17 is formed in the edge termination region 40. The state up to here is depicted in FIG. 11. Next, the ion implantation mask 20b is removed.

Figure 12:
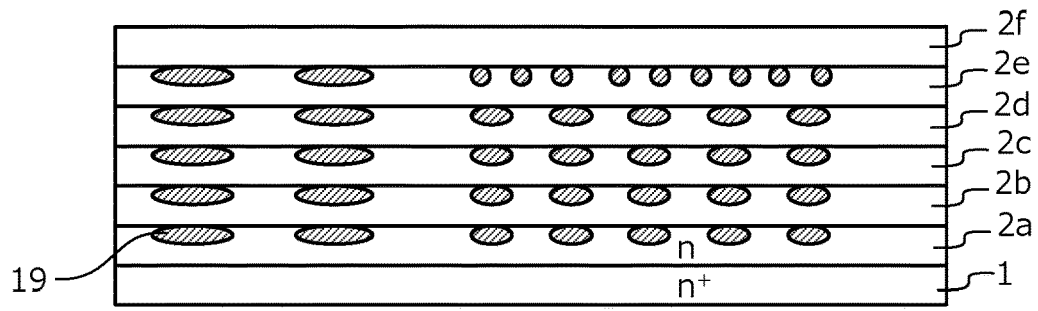
FIG. 12 is a cross-sectional view of the SJ-MOSFET according to the first and the second embodiments during manufacture.

Next, on a front side of the n-type layer 2e, an n-type layer 2f having an impurity concentration that is about equal to the impurity concentration of the n-type layer 2e is formed by epitaxial growth. The state up to here is depicted in FIG. 12.

Next, a heat treatment (annealing) for activating the p-type regions 19 is performed. Ion implanted impurities are diffused by this heat treatment, whereby the diffused impurities are connected in a vertical direction and the p-type column regions 4a, 4b are formed. Further, intervals between the p-type regions 19 formed in the n-type layer 2e become narrower, whereby the diffused impurities are connected in a horizontal direction and the RESURF region 17 is formed.

Here, in the edge termination region 40, the widths of the openings of the mask are narrower than those in the active region 30 and therefore, the impurity amount implanted in a single region is lower and an amount of diffusion is lower. Therefore, during the heat treatment, the impurities do not reach the surface of the n-type region 2f. Thus, the n-type region 18 is formed on top of the RESURF region 17.

Figure 13:
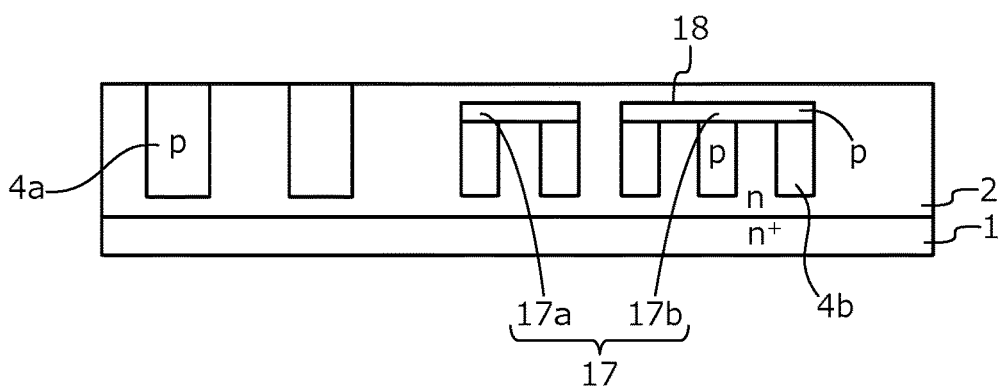
FIG. 13 is a cross-sectional view of the SJ-MOSFET according to the first and the second embodiments during manufacture.

Meanwhile, in the active region 30, the impurity amount is relatively greater as is the amount of diffusion and therefore, the impurities reach the surface of the n-type region 2f and the p-type column regions 4a are exposed at the surface. While in some instances the impurities in the active region 30 may not reach the surface of the n-type region 2f due to the impurity amount, when the p-type base regions 5 are formed, ion implantation is performed and therefore, in the active region 30, the p-type column regions 4a and the p-type base regions 5 are connected and are exposed at the surface. The state up to here is depicted in FIG. 13.

Next, on the respective surfaces of the n-type column regions 3a and the p-type column regions 4a in the active region 30, a mask having predetermined openings is formed by a photolithographic technique, for example, using a resist. Subsequently, a p-type impurity is ion implanted using this resist mask as a mask. As a result, the p-type base regions 5 are formed in a portion of a surface region of the n-type column regions 3a and surface regions of the p-type column regions 4a overall. Next, the mask used during the ion implantation for forming the p-type base regions 5 is removed.

Next, on the surfaces of the p-type base regions 5, a mask having predetermined openings is formed by a photolithographic technique, for example, using a resist. Subsequently, an n-type impurity is ion implanted using this resist mask as a mask. As a result, the $n^+$-type source regions 6 are formed in portions of surface regions of the p-type base regions 5. Next, the mask used during the ion implantation for forming the $n^+$-type source regions 6 is removed.

Next, a heat treatment (annealing) for activating the p-type base regions 5 and the $n^+$-type source regions 6 is performed. Further, a sequence in which the p-type base regions 5 and the $n^+$-type source regions 6 are formed may be variously changed.

Next, the front side of the semiconductor base is thermally oxidized, thereby forming the gate insulating film 7. Next, on the gate insulating film 7, for example, a polycrystalline silicon layer doped with phosphorus is formed as the gate electrodes 8. Next, the polycrystalline silicon layer is patterned and selectively removed, leaving the polycrystalline silicon layer on portions of the p-type base regions 5, the portions between the $n^+$-type source regions 6 and the n-type column regions 3a. Here, the polycrystalline silicon layer may be further left on the n-type column regions 3a.

Next, for example, a phosphosilicate glass (PSG) is deposited as the insulating film 13 so as to cover the gate electrodes 8. Next, the insulating film 13 and the gate insulating film 7 are patterned and selectively removed. For example, the insulating film 13 and the gate insulating film 7 on the $n^+$-type source regions 6 are removed, thereby forming contact holes and exposing the $n^+$-type source regions 6. Next, a heat treatment (reflow) for planarizing the interlayer insulating film is performed.

Next, the source electrode 10, the field plate electrode 15, and the stopper electrode 16 are deposited by sputtering; and the source electrode 10, the field plate electrode 15, and the stopper electrode 16 are patterned by photolithography and etching. Here, in the contact holes, the source electrode 10 is embedded, electrically connecting the $n^+$-type source regions 6 and the source electrode 10. In the contact holes, a tungsten plug, etc. may be embedded via a barrier metal.

Next, on a surface (the back surface of the semiconductor base) of the $n^+$-type semiconductor substrate 1, for example, a nickel film is deposited as the drain electrode 14. Subsequently, a heat treatment is performed, thereby forming an ohmic contact between the $n^+$-type semiconductor substrate 1 and the drain electrode 14. Thus, the SJ-MOSFET 50 depicted in FIG. 1 is completed.

As described above, according to the first and the second embodiments, the RESURF region is divided into two or more regions. As a result, the RESURF region nearest the stopper electrode becomes a buffer, thereby enabling sharp decreases in the breakdown voltage to be mitigated. Therefore, it becomes possible to suppress decreases in the breakdown voltage with respect to manufacturing variation. Further, when charge accumulates on the protective film, movement of the equipotential lines stops at each point of division of the RESURF region and effects of the charge are localized. Therefore, fluctuation of the breakdown voltage when charge accumulates on the protective film of the semiconductor device may be suppressed.

Figure 14:
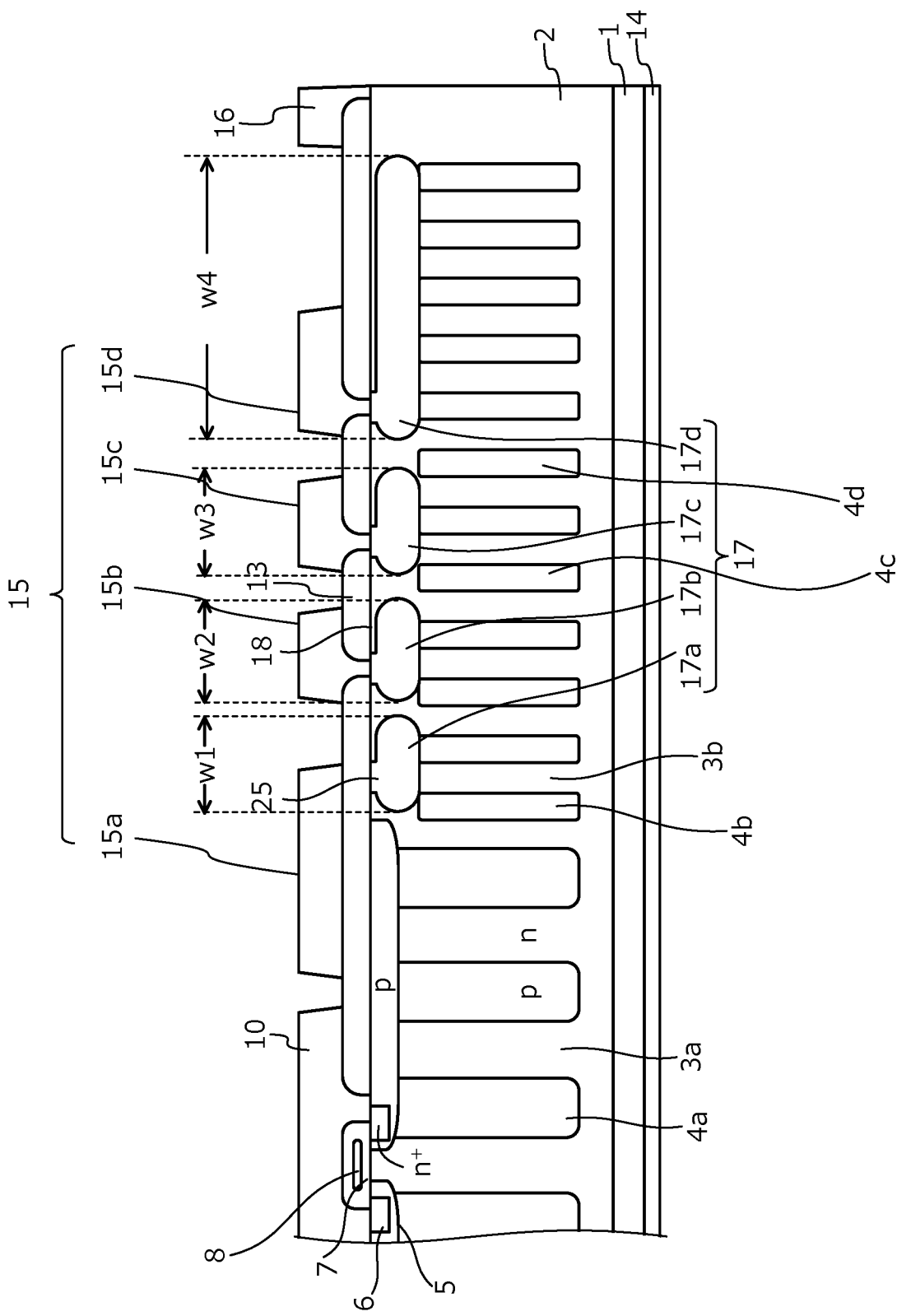
FIG. 14 is a cross-sectional view of a structure of the SJ-MOSFET according to a third embodiment.

FIG. 14 is a cross-sectional view of a structure of the SJ-MOSFET according to a third embodiment. The third embodiment differs from the first embodiment and the second embodiment in that the RESURF region 17 is divided into four regions: the first RESURF region 17a, the second RESURF region 17b, a third RESURF region 17c, and a fourth RESURF region 17d.

In the third embodiment, the width w1 of the first RESURF region 17a, the width w2 of the second RESURF region 17b, a width w3 of the third RESURF region 17c, and a width w4 of the fourth RESURF region 17d may have a relationship of w1≤w2≤w3≤w4. In FIG. 14, the end 25 of the first RESURF region 17a may be a portion of one of the p-type base regions 5 and the first RESURF region 17a may be connected to the field plate electrode 15a via the p-type base region 5. Similarly, the second RESURF region 17b, the third RESURF region 17c, and the fourth RESURF region 17d may be connected respectively to the field plate electrode 15b, the field plate electrode 15c, and the field plate electrode 15d, via the p-type base regions 5.

The field plate electrode 15a may serve as a gate electrode electrically connected to the gate electrodes 8. However, when the field plate electrodes 15b, 15c, 15d are electrically connected to the gate electrodes 8, the electric potential becomes equal to that of the gate electrodes 8 and the breakdown voltage cannot be maintained. Therefore, the field plate electrodes 15b, 15c, 15d are not electrically connected to the gate electrodes 8.

A p-type column region 4c and a p-type column region 4d disposed at ends of the third RESURF region 17c, respectively may or may not be in contact with the third RESURF region 17c.

As described above, according to the third embodiment, the RESURF region is divided into four regions. As a result, similarly to the first and the second embodiments, sharp decreases in the breakdown voltage may be mitigated and it becomes possible to suppress decreases in the breakdown voltage with respect to manufacturing variation. Furthermore, movement of the equipotential lines stops at each point of division of the RESURF region and therefore, the third embodiment enables greater localization of the effects of charge as compared to the first and the second embodiments in which the RESURF region is divided into two regions. Therefore, the third embodiment enables greater suppression of the fluctuation of the breakdown voltage when charge accumulates on the protective film of the semiconductor device as compared to the first and the second embodiments.

Figure 15:
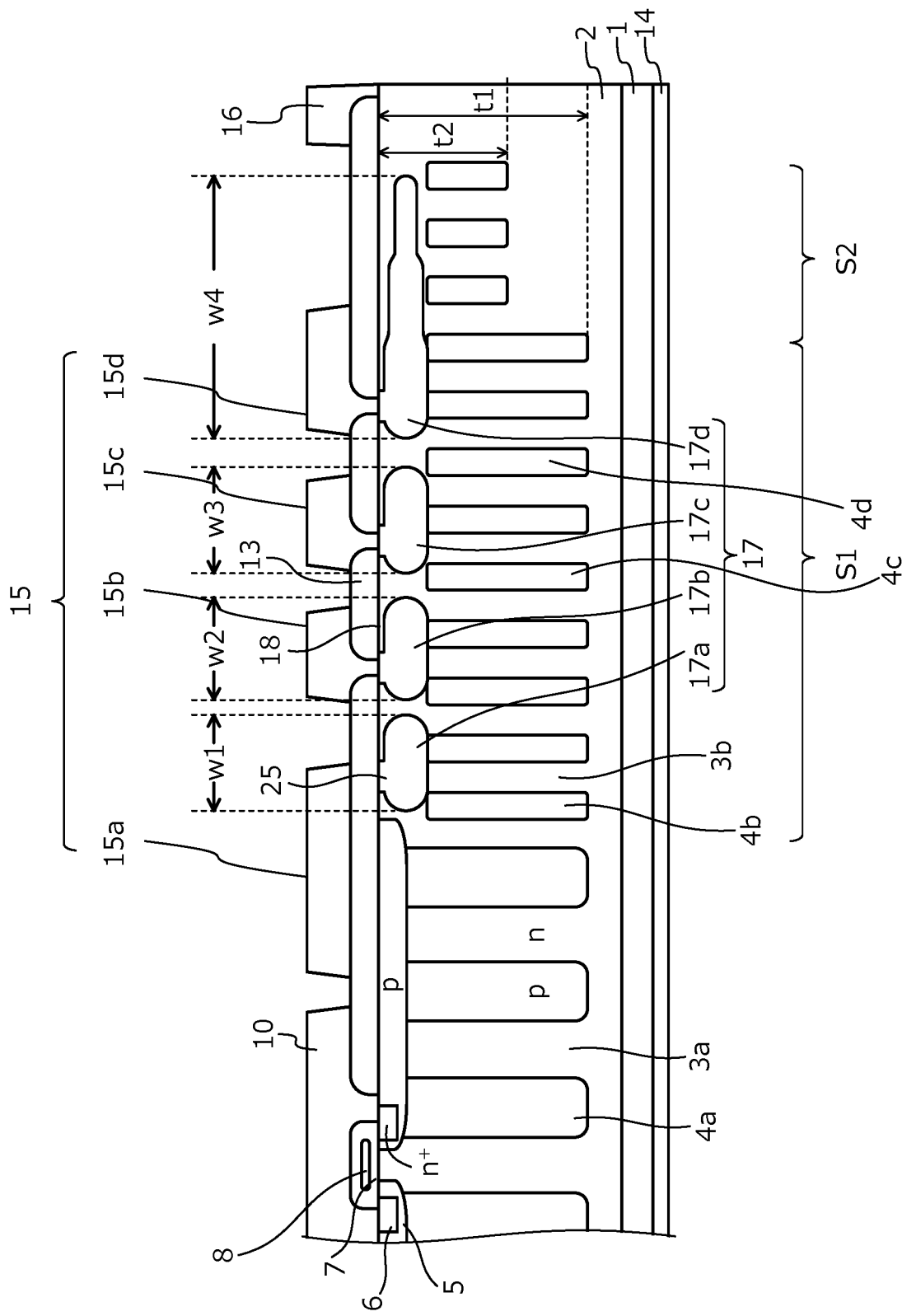
FIG. 15 is a cross-sectional view of a structure of the SJ-MOSFET according to a fourth embodiment.

FIG. 15 is a cross-sectional view of a structure of the SJ-MOSFET according to a fourth embodiment. In the fourth embodiment, the impurity concentration of the fourth RESURF region 17d and lengths of the p-type column regions 4b near the stopper electrode 16 differ from those in the third embodiment. In the fourth embodiment, similarly to the third embodiment, the width w1 of the first RESURF region 17a, the width w2 of the second RESURF region 17b, the width w3 of the third RESURF region 17c, and the width w4 of the fourth RESURF region 17d may have the relationship of w1≤w2≤w3≤w4.

As depicted in FIG. 15, in the fourth embodiment, the second parallel pn structure in the edge termination region 40 is configured by an inner structure S1 on an element-inner-side (side toward the active region 30) and an outer structure S2 on an element-outer-side (side toward the stopper electrode 16), the outer structure S2 separated further from the active region 30 than is the inner structure S1. A length t2 of the p-type column regions 4b of the outer structure S2, from the surface of the n-type drift layer, may be less than or equal to a length t1 of the p-type column regions 4b of the inner structure S1, from the surface of the n-type drift layer (the length t2 suffices to be the length t1 or less (t2≤t1)). The p-type column region 4c and the p-type column region 4d disposed respectively at the ends of the third RESURF region 17c may or may not be in contact with the third RESURF region 17c.

Figure 16:
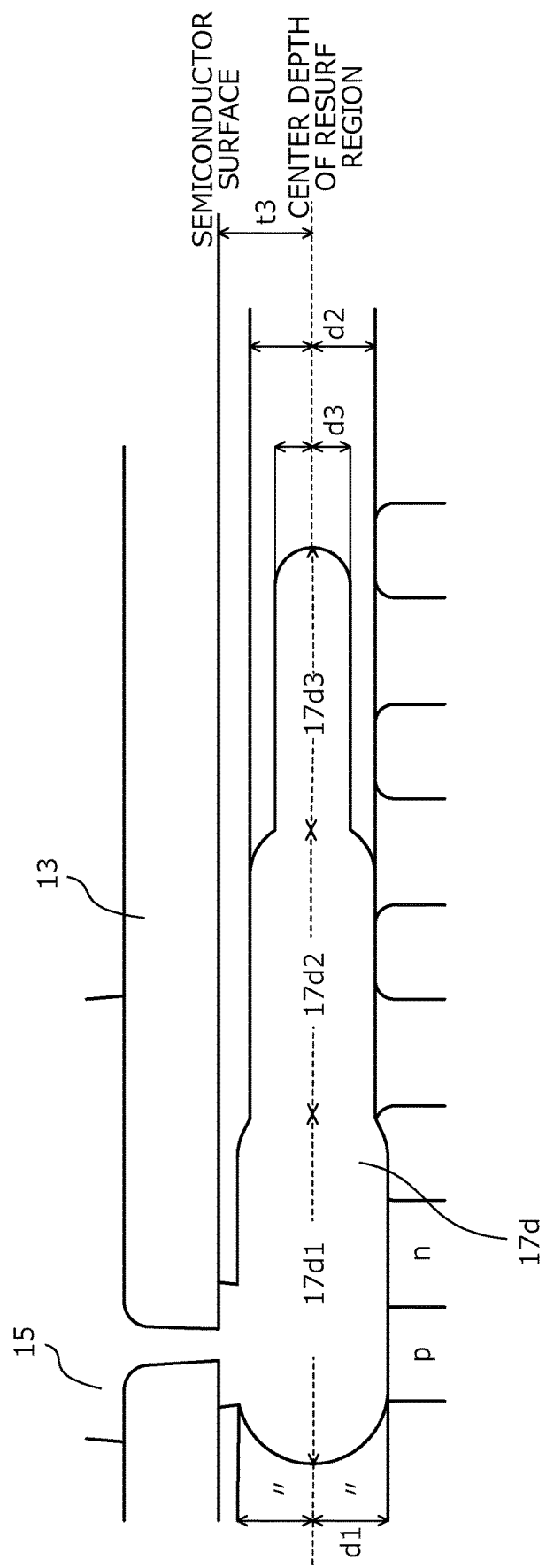
FIG. 16 is a detailed cross-sectional view of a structure of a RESURF layer of the SJ-MOSFET according to the fourth embodiment.

FIG. 16 is a detailed cross-sectional view of a structure of the RESURF layer of the SJ-MOSFET according to the fourth embodiment. FIG. 16 is an enlarged view of the fourth RESURF region 17d. As depicted in FIG. 16, the width of the fourth RESURF region 17d decreases with increasing proximity of the fourth RESURF region 17d to the stopper electrode 16. Further, the impurity concentration the fourth RESURF region 17d decreases with increasing proximity of the fourth RESURF region 17d to the stopper electrode 16. The fourth RESURF region 17d has a first part 17d1 on an element-inner-side (side toward the active region 30), a second part 17d2 separated further from the active region 30 than is the first part 17d1, and a third part 17d3 on an element-outer-side (side toward the stopper electrode 16) and separated further from the active region 30 than is the second part 17d2. A (diffusion) distance from a RESURF region center depth t3 of the first part 17d1 to the surface is assumed as d1; the impurity concentration is assumed as D1; a (diffusion) distance from the RESURF region center depth t3 of the second part 17d2 to the surface is assumed as d2; the impurity concentration is assumed as D2; a (diffusion) distance from the RESURF region center depth t3 of the third part 17d3 to the surface is assumed as d3; and the impurity concentration is assumed as D3. In this case, respective relationships may be d1>d2>d3 and D1:D2=1.5:1 to 1.2:1, D2:D3=1:0.75 to 1:0.5.

In the fourth embodiment, while only the fourth RESURF region 17d is formed so that the width and the impurity concentration thereof decrease with increasing proximity to the stopper electrode 16, the first RESURF region 17a, the second RESURF region 17b, and the third RESURF region 17c may be similarly formed.

As described above, in the fourth embodiment, the fourth RESURF region is formed having the width and the impurity concentration thereof decreasing with increasing proximity to the stopper electrode 16. As a result, the fourth embodiment may further suppress the fluctuation of the breakdown voltage when charge accumulates on the protective film of the semiconductor device as compared to the first to the third embodiments.

Figure 17:
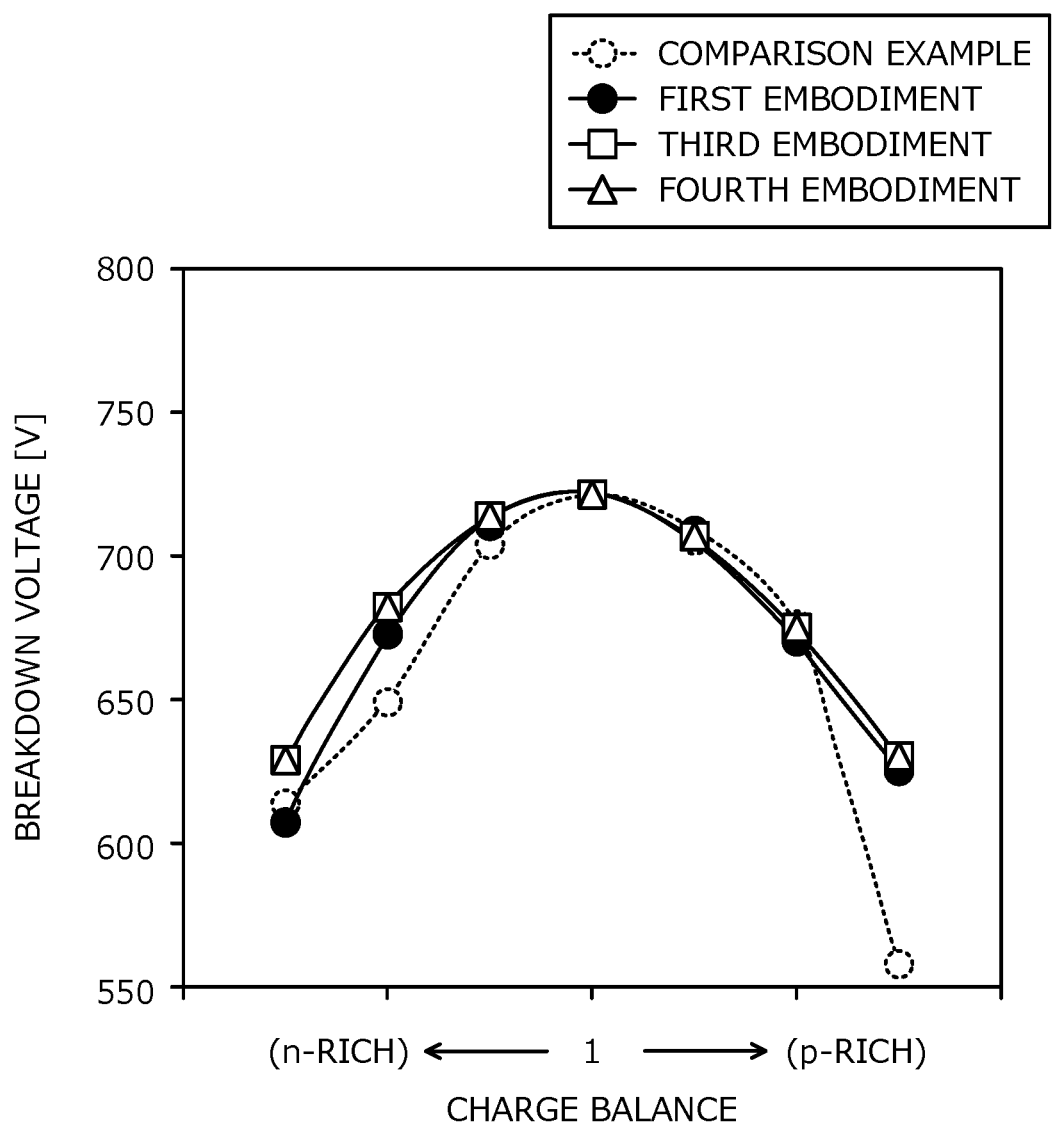
FIG. 17 is a graph depicting a relationship between breakdown voltage and charge balance in a SJ-MOSFET of a comparison example and in the SJ-MOSFETs according to the first, the third, and the fourth embodiments.

FIG. 17 is a graph depicting a relationship between the breakdown voltage and the charge balance in the SJ-MOSFET of the comparison example and in the SJ-MOSFETs according to the first, the third, and the fourth embodiments.

As depicted in FIG. 6, the SJ-MOSFET of the comparison example differs from the SJ-MOSFET according to the first embodiment in that the RESURF region 117 is not divided into the first RESURF region 17*a* and the second RESURF region 17*b*. In FIG. 17, a vertical axis represents breakdown voltage of the SJ-MOSFET in units of V. A horizontal axis represents charge balance, and depicts a state when in the first and the second parallel pn regions where the charge balance is "1", the impurity amounts of the n-type column regions 3*a*, 3*b* are substantially equal to the impurity amounts of the p-type column regions 4*a*, 4*b*, where a position closer to an origin than to the charge balance of "1" ((n rich) side) is a state in which the n-type impurity amount is relatively greater and a position further from the origin than is the charge balance of "1" ((p rich) side) is a state in which the p-type impurity amount is relatively greater.

As depicted in FIG. 17, when the charge balance is "1", the SJ-MOSFETs according to the first, the third, and the fourth embodiments have a breakdown voltage equal to that of the SJ-MOSFET of the comparison example. Further, the SJ-MOSFETs according to the first, the third, and the fourth embodiments minimize decreases in the breakdown voltage to a greater extent than does the SJ-MOSFET of the comparison example, even in a state where the charge balance is biased (a state where the impurity amount of either the n-type or the p-type is relatively greater). Further, the SJ-MOSFETs according to the third and the fourth embodiments minimize decreases in the breakdown voltage to a greater extent than does the SJ-MOSFET according to the first embodiment in a state where the charge balance is biased.

In the SJ-MOSFET according to the second embodiment as well, similar effects are obtained. Further, even when the cross-sectional shape according to the first embodiment depicted in FIG. 1 and the cross-sectional shape according to the second embodiment depicted in FIG. 5 are both present in a single SJ-MOSFET, similar effects are obtained.

Figure 18:
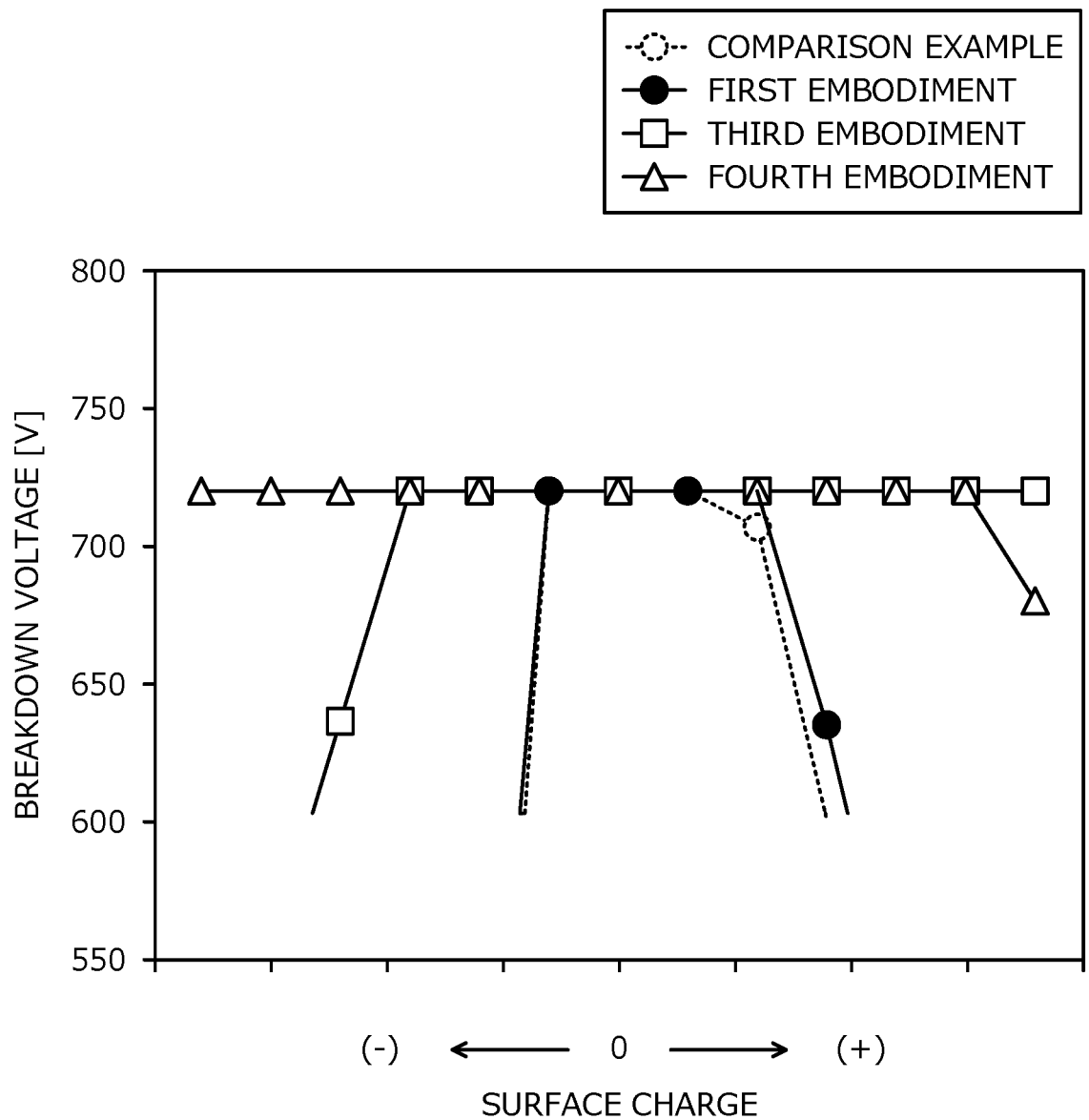
FIG. 18 is a graph depicting a relationship between breakdown voltage and surface charge in the SJ-MOSFET of the comparison example and in the SJ-MOSFETs according to the first, the third, and the fourth embodiments.
Figure 19:
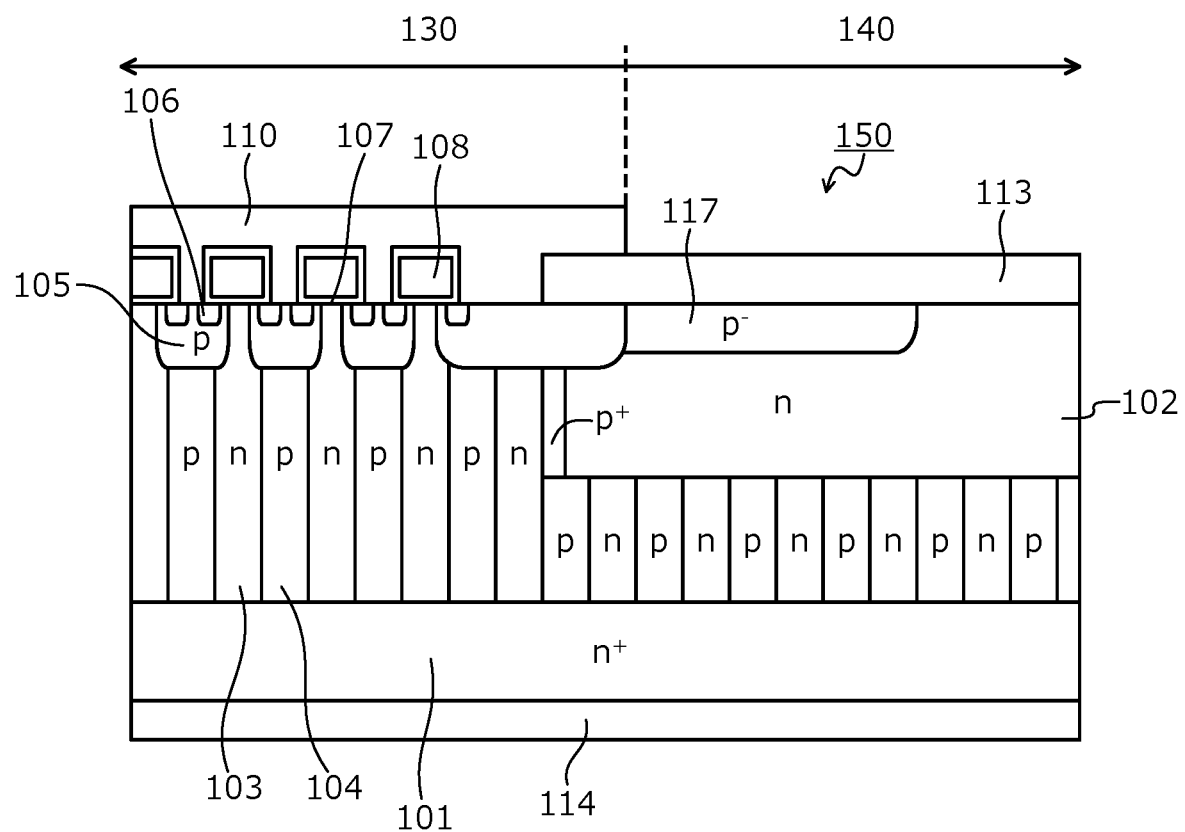
FIG. 19 is a cross-sectional view of a structure of a conventional SJ-MOSFET.

FIG. 18 is a graph depicting a relationship between the breakdown voltage and the surface charge in the SJ-MOSFET of the comparison example and in the SJ-MOSFETs according to the first, the third, and the fourth embodiments. In FIG. 18, a vertical axis represents the breakdown voltage of the SJ-MOSFET in units of V. A horizontal axis represents the surface charge. On the horizontal axis, a position of "0" represents a state of zero surface charge, whereas closer to an origin than is the position of "0" (negative (−) side) represents a state where negative charge is relatively greater and further from the origin than is the position of "0" (plus (+) side) represents a state where positive charge is relatively greater. Further, FIG. 18 depicts a relationship between the breakdown voltage and the surface charge when the charge balance is "1". The surface charge is charge that accumulates at a surface protective film (for example, the surface protective film 70 depicted in FIGS. 6, 7A, and 7B) disposed on a most superficial surface of the superjunction semiconductor device (SJ-MOFET).

As depicted in FIG. 18, in an instance of a state in which the surface charge is zero, the SJ-MOSFETs according to the first, the third, and the fourth embodiments have a breakdown voltage equal to that of the SJ-MOSFET of the comparison example. The SJ-MOSFET according to the first embodiment has a breakdown voltage equal to that of the SJ-MOSFET of the comparison example even in a state where negative charge is relatively greater. On the other hand, the SJ-MOSFET according to the first embodiment minimizes decreases in the breakdown voltage to a greater extent than does the SJ-MOSFET of the comparison example in a state where positive charge is relatively greater.

The SJ-MOSFETs according to the third and the fourth embodiments minimize decreases in the breakdown voltage to a greater extent than does the SJ-MOSFET of the comparison example in a state where negative charge is relatively greater and in a state where positive charge is relatively greater. Further, in a state where positive charge is relatively greater, the SJ-MOSFET according to the third embodiment minimizes decreases in the breakdown voltage to the greatest extent. In a state where negative charge is relatively greater, the SJ-MOSFET according to the fourth embodiment minimizes decreases in the breakdown voltage to the greatest extent.

In the SJ-MOSFET according to the second embodiment as well, similar effects are obtained. Further, even when the cross-sectional shape according to the first embodiment depicted in FIG. 1 and the cross-sectional shape according to the second embodiment depicted in FIG. 5 are both present in a single SJ-MOSFET, similar effects are obtained.

In the foregoing, while the present invention is described taking, as an example, a case of configuration of a MOS gate structure on a first main surface of a silicon substrate, without limitation hereto, various modifications are possible such as the type (for example, silicon carbide (SiC), etc.) of semiconductor and plane orientation of a main surface of the substrate. Further, in the embodiments, while the first conductivity type is assumed to be a p-type and the second conductivity type is assumed to be an n-type, the present invention is similarly implemented when the first conductivity type is an n-type and the second conductivity type is a p-type.

According to the present invention described above, the RESURF region (first semiconductor region of the second conductivity type) is divided into two or more regions. As a result, the RESURF region near the stopper electrode becomes a buffer, thereby enabling sharp decreases in the breakdown voltage to be suppressed. Therefore, it becomes possible to suppress decreases in the breakdown voltage with respect to manufacturing variation. Further, when charge accumulates on the protective film, movement of the equipotential lines stops at the point of division of the RESURF region and effects of the charge are localized. Therefore, fluctuation of the breakdown voltage when charge accumulates on the protective film of the semiconductor device may be suppressed.

Further, movement of the equipotential lines stops at each point of division of the RESURF region and therefore, division of the RESURF region into four regions enables effects of the charge to be further localized as compared to division of the RESURF region into two regions and enables further suppression of the fluctuation of the breakdown voltage when charge accumulates on the protective film of the semiconductor device. Additionally, in the embodiments, the width and the impurity concentration of the RESURF region decrease with increasing proximity to an element outer side, whereby the fluctuation of the breakdown voltage when charge accumulates on the protective film of the semiconductor device may be further suppressed.

The superjunction semiconductor device and the method of manufacturing a superjunction semiconductor device according to the present invention achieve an effect in that decreases in the breakdown voltage may be suppressed with respect to manufacturing variation.

As described above, the superjunction semiconductor device and the method of manufacturing a superjunction semiconductor device according to the present invention are useful for high-voltage semiconductor devices used in power converting equipment and in power source devices such as those in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A superjunction semiconductor device having an active region through which current flows and a termination structure region having a voltage withstanding structure disposed at an outer side of the active region and surrounding a periphery of the active region, the superjunction semiconductor device comprising:
    a semiconductor substrate of a first conductivity type, having a front surface and a back surface opposite to the front surface;
    a first semiconductor layer of the first conductivity type, provided on the front surface of the semiconductor substrate and having an impurity concentration lower than an impurity concentration of the semiconductor substrate;
    a first parallel pn structure provided on an upper surface of the first semiconductor layer in the active region and including a plurality of first columns of the first conductivity type and a plurality of second columns of a second conductivity type, the plurality of first columns and the plurality of second columns being disposed to repeatedly alternate with one another on a plane parallel to the front surface of the semiconductor substrate;
    a second parallel pn structure provided on the upper surface of the first semiconductor layer in the termination structure region and including a plurality of third columns of the first conductivity type and a plurality of fourth columns of the second conductivity type, the plurality of third columns and the plurality of fourth columns being disposed repeatedly to alternate with one another on a plane parallel to the front surface of the semiconductor substrate;
    a first semiconductor region of the second conductivity type, provided directly on an upper surface of the second parallel pn structure in the termination structure region, the first semiconductor region including a plurality of regions apart from each other;
    a plurality of second semiconductor regions of the second conductivity type, each of which is provided on a surface of one or more of the plurality of second columns and has a first side facing the semiconductor substrate and a second side opposite to the first side, each of the plurality of second semiconductor regions having a surface layer;
    a third semiconductor region of the first conductivity type selectively provided in the surface layer of each of the plurality of second semiconductor regions;
    a fourth semiconductor region of the first conductivity type, provided on the first semiconductor region at a side opposite to a side at which the second parallel pn structure is provided;
    a gate insulating film in contact with the plurality of second semiconductor regions and having a first surface in contact with the plurality of second semiconductor regions and a second surface opposite to the first surface; and
    a gate electrode provided on the second surface of the gate insulating film, wherein
    the first semiconductor region includes a first region, a second region positioned further from the active region than is the first region, a third region positioned further from the active region than is the second region, and a fourth region positioned further from the active region than is the third region, and
    in the direction parallel to the front surface of the semiconductor substrate, a width w1 of the first region and a width w4 of the fourth region satisfy w1<w4.

2. The superjunction semiconductor device according to claim 1, wherein in a direction parallel to the front surface of the semiconductor substrate, the width w1 of the first region, a width w2 of the second region, a width w3 of the third region, and the width w4 of the fourth region satisfy w1≤w2≤w3≤w4.

3. The superjunction semiconductor device according to claim 1, further comprising
    an electrode provided in the termination structure region, wherein
    each of the first region, the second region, the third region, and the fourth region is electrically connected to the electrode via a respective one of the plurality of second semiconductor regions.

4. The superjunction semiconductor device according to claim 1, wherein
    the second parallel pn structure includes an inner structure having a first group of fourth columns among the plurality of fourth columns, and an outer structure positioned further from the active region than is the inner structure and having a second group of fourth columns among the plurality of fourth columns, and
    in a direction orthogonal to the front surface of the semiconductor substrate, a distance from the upper surface of the first semiconductor layer to a bottom of each of the second group of fourth columns among the plurality of fourth columns of the outer structure is less than or equal to a distance from the upper surface of the first semiconductor layer to a bottom of each of the first group of fourth columns among the plurality of fourth columns of the inner structure.

5. The superjunction semiconductor device according to claim 1, wherein at least one among the first region, the second region, the third region, and the fourth region has an impurity concentration that increases with proximity of the at least one to the active region.

6. The superjunction semiconductor device according to claim 1, wherein
    at least one among the first region, the second region, the third region, and the fourth region has a first part near the active region, a second part positioned further from the active region than is the first part, and a third part positioned further from the active region than is the second part, and
    an impurity concentration D1 of the first part, an impurity concentration D2 of the second part, and an impurity concentration D3 of the third part have ranges of ratios satisfying D1:D2=1.5:1 to 1.2:1 and D2:D3=1:0.75 to 1:0.5.

7. The superjunction semiconductor device according to claim 6, wherein
    each of the first to third parts has an upper surface,
    the first semiconductor region has a center plane that is parallel to the front surface of the semiconductor substrate, and
    in a direction orthogonal to the front surface of the semiconductor substrate, a distance d1 from the upper surface of the first part to the center plane of the first semiconductor region, a distance d2 from the upper surface of the second part to the center plane of the first semiconductor region, and a distance d3 from the upper surface of the third part to the center plane of the first semiconductor region satisfy d1>d2>d3.

8. A method of manufacturing the superjunction semiconductor device according to claim 1, the method comprising:
   in a first process, forming the first semiconductor layer of the first conductivity type;
   in a second process, forming, in the active region of the first semiconductor layer, the first parallel pn structure and forming, in the termination structure region of the first semiconductor layer, the second parallel pn structure;
   in a third process, forming, in the active region, a second first parallel pn structure on the surface of the first parallel pn structure formed in the second process and forming, in the termination structure region, the first semiconductor region of the second conductivity type on the surface of the second parallel pn structure;
   in a fourth process, forming the plurality of second semiconductor regions of the second conductivity type each of which is formed on the surface of one or more of the plurality of second columns of the first parallel pn structure in the active region;
   in a fifth process, selectively forming the third semiconductor region of the first conductivity type in the surface layer of each of the second semiconductor regions;
   in a sixth process, forming the gate insulating film in contact with the second semiconductor regions; and
   in a seventh process, forming the gate electrode on the second surface of the gate insulating film.

9. The method according to claim 8, wherein in the third process, the second first parallel pn structure and the first semiconductor region are formed concurrently by epitaxial growth and an ion implantation.

10. The method according to claim 9, wherein a first opening width of a photoresist of the ion implantation when forming the second parallel pn structure is greater than a second opening width of the photoresist of the ion implantation when forming the first semiconductor region.

11. The method according to claim 9, wherein in the third process, an impurity is implanted in a plurality of areas by the ion implantation and the implanted impurity is diffused by a heat treatment to form the first semiconductor region.

12. The superjunction semiconductor device according to claim 1, wherein
   in a direction parallel to the front surface of the semiconductor substrate, a width of each of the plurality of first columns and a width of each of the plurality of second columns of the first parallel pn structure in the active region are greater than a width of each of the plurality of third columns and a width of each of the plurality of fourth columns of the second parallel pn structure in the termination structure region.

* * * * *